United States Patent [19]
White

[11] Patent Number: 6,067,236
[45] Date of Patent: May 23, 2000

[54] POWER SUPPLY FOR PROVIDING HIGH VOLTAGE POWER FROM A LOW VOLTAGE SOURCE

[75] Inventor: Robert Keith White, Los Osos, Calif.

[73] Assignee: Rantec Microwave & Electronics Inc., Los Osos, Calif.

[21] Appl. No.: 08/962,762

[22] Filed: Nov. 3, 1997

[51] Int. Cl.$^7$ .......................... H02M 3/335; H02M 3/24; G05F 1/40

[52] U.S. Cl. ............................ 363/16; 363/80; 363/97; 323/266

[58] Field of Search ............................... 363/15, 16, 80, 363/97, 98, 17, 131, 132; 323/265, 266, 268

[56] References Cited

U.S. PATENT DOCUMENTS

| | | | |
|---|---|---|---|
| 4,187,535 | 2/1980 | Wigley et al. | 363/16 |
| 4,398,120 | 8/1983 | Guillon | 363/59 |
| 4,590,546 | 5/1986 | Maile | 363/37 |
| 4,616,300 | 10/1986 | Santelmann, Jr. | 363/21 |
| 4,757,433 | 7/1988 | Santelmann, Jr. | 363/19 |
| 4,775,821 | 10/1988 | Sikora | 363/19 |
| 5,329,222 | 7/1994 | Gyugi et al. | 323/207 |
| 5,461,301 | 10/1995 | Troung | 323/207 |
| 5,570,276 | 10/1996 | Cuk et al. | 363/16 |
| 5,587,893 | 12/1996 | Teng | 363/61 |
| 5,650,694 | 7/1997 | Jayaraman et al. | 363/56 |

OTHER PUBLICATIONS

"A Word About 'Chips'", VMI Beta Book, 3rd Ed., 1996, p. 259.

Ruitberg et al, "Design Techniques for Miniaturized Spacecraft High Voltage Power Supplies", pp. D2–1–D2–13.

Johnson et al, "A Comparison of Resonant Topologies in High Voltage DC Applications", Conference Proceedings of the 2nd Annual IEEE Applied Electronics Power Conference and Exposition, Mar. (1987), pp. 145–156.

Todd et al, "Practical resonant power converters—theory and application, Part II—the resonant switch concept", Power Technics Magazine, May 1986, pp. 29–34.

Pressman, "Switching and Linear Supply Converter Designs", Hayden Book Co., Inc., 1985, pp. 144–148.

*Primary Examiner*—Peter S. Wong
*Assistant Examiner*—Bao Q. Vu
*Attorney, Agent, or Firm*—Pillsbury Madison & Sutro LLP

[57] ABSTRACT

A power supply device provides high voltage power from a low voltage source. The power supply device can be manufactured so as to have a thin profile and therefore is particularly well-suited for use as a power supply for a flat screen CRT (cathode ray tube). The power supply device includes a voltage regulator, a DC-to-AC converter, and a multiplier. The voltage regulator is connectable to the low-voltage source and is arranged so as to step-down a source voltage level of the low-voltage source to produce an input voltage at a lower voltage level than the source voltage level. The DC-to-AC converter is connected to the input voltage from the voltage regulator and is arranged so as to convert the input voltage into an AC voltage. The multiplier is connected to the AC voltage from the DC-to-AC converter and is arranged so as to convert the AC voltage into a substantially DC output signal having a DC voltage level which is significantly higher than the source voltage level. Preferably, the multiplier includes an assembly of capacitors and diodes which are interconnected to form a voltage multiplier. A regulator controller can be connected, at least indirectly, to the multiplier so that when the multiplier is connected to an electrical load, a voltage indicative of current flowing between the multiplier and the electrical load and the input voltage itself dynamically controls the voltage regulation provided by the regulator.

27 Claims, 15 Drawing Sheets

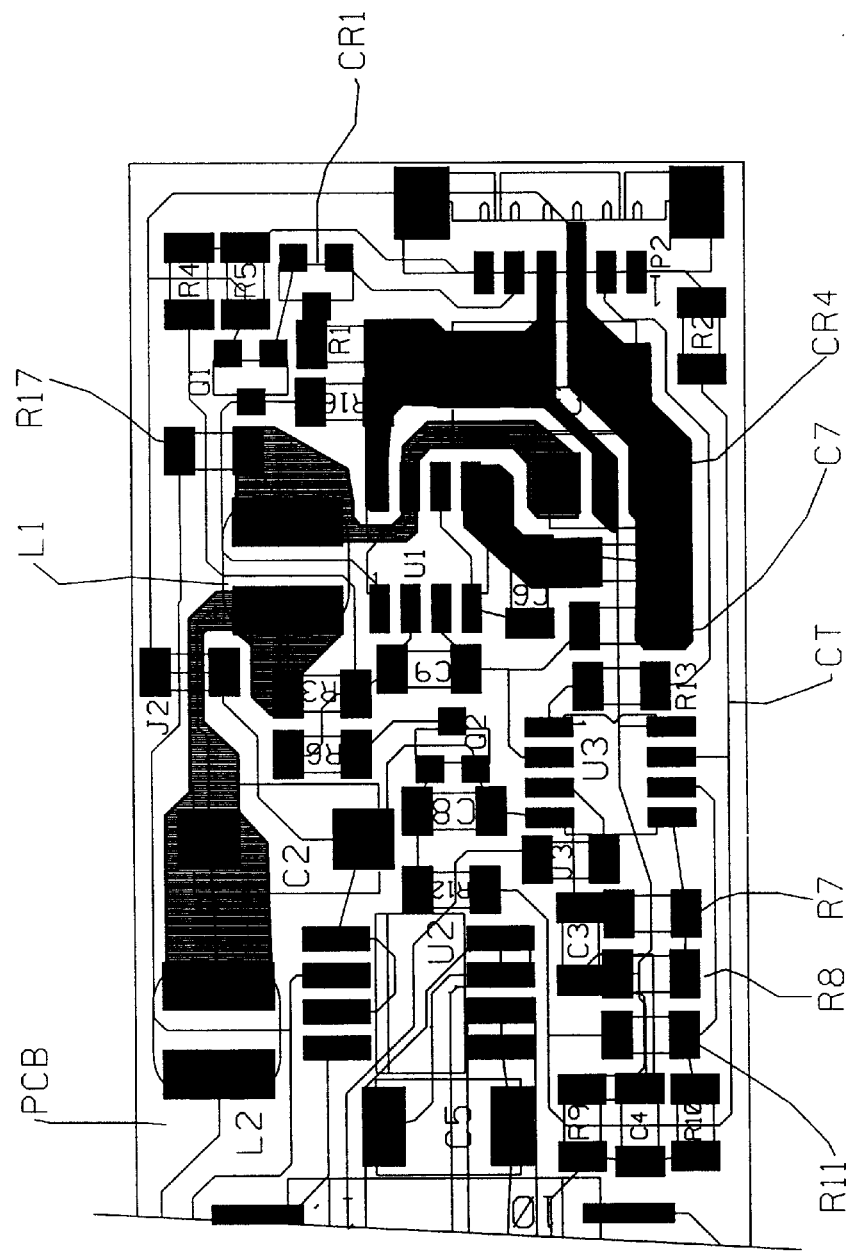

6,067,236

POWER SUPPLY FOR PROVIDING HIGH VOLTAGE POWER FROM A LOW VOLTAGE SOURCE

BACKGROUND OF THE INVENTION

The present invention relates to a power supply for providing high voltage power from a low voltage source. The present invention can be manufactured so as to have a thin profile and therefore is particularly well-suited for use as a power supply for a flat screen CRT (cathode ray tube).

Although the general concept of providing power conversion is known, the recently developed technology of flat screen CRTs has presented a greater need for power conversion circuitry capable of providing high voltage power from a low voltage source (e.g., 8,000 volts from a 5 volt source). In order to maximize the compactness of such flat screen CRTs, it is important that their power supplies also be compact. Further, in the highly competitive market for consumer electronics, it is important that the power supply be constructed at the lowest cost possible and therefore in a manner which permits automated manufacturing.

SUMMARY OF THE INVENTION

It is therefore a primary object of the present invention to provide a power supply device capable of providing high voltage power from a low voltage source.

Another object of the present invention is to provide such a power supply device using components which facilitate automated manufacturing of the power supply device.

Yet another object of the present invention is to provide a power supply device which can be manufactured using "surface-mount" electrical components which are mounted to a printed circuit board and provide a thin overall profile.

Another object of the present invention is to provide a power supply device having a high output-to-input voltage ratio (e.g., at least 1000), compact size, and a relatively steady output voltage which remains within 10%, and preferably within 5%, of a desired voltage level, even if the load on the power supply varies significantly.

Yet another object of the present invention is to provide a power supply device having a high output-to-input voltage ratio, and also capable of providing power conversion in a relatively efficient manner (e.g., with a power efficiency of at least 75%).

A power supply device according to the present invention therefore includes a voltage regulator, a DC-to-AC converter, and a multiplier. The voltage regulator is connectable to a low-voltage source (e.g., a 5 volt battery) and is arranged so as to step-down a source voltage level of the low-voltage source to produce an input voltage at a lower voltage level than the source voltage level.

The DC-to-AC converter is connected to the input voltage from the voltage regulator and is arranged so as to convert the input voltage into an AC voltage.

The multiplier is connected to the AC voltage from the DC-to-AC converter and is arranged so as to convert the AC voltage into a DC output signal having a DC voltage level which is significantly higher than the source voltage level. Preferably, the multiplier includes an assembly of capacitors and diodes which are interconnected to form a voltage multiplier.

According to a preferred embodiment, the power supply device further includes a regulator controller connected, at least indirectly, to the multiplier. The regulator controller is arranged so that when the multiplier is connected to an electrical load, a voltage indicative of current flowing between the multiplier and the electrical load is applied to the regulator controller. In response to this voltage, the regulator controller provides a control signal to the regulator. Preferably, the control signal is dependent, at least in part, on the voltage indicative of current. The regulator then dynamically regulates the input voltage level in a manner dependent upon the control signal.

The power supply device may also include sampling circuitry connected electrically between the multiplier and the regulator controller. The sampling circuitry provides the voltage indicative of current without drawing more than 0.003% of the power flowing to the electrical load.

Preferably, the regulator controller is connected also to the input voltage. As a result, the control signal is provided to the dynamic regulator in a manner dependent on both the input voltage and the voltage indicative of current.

In particular, the regulator controller is arranged so as to selectively determine a level of the control signal such that 1) when the voltage indicative of current indicates that the current flowing between the multiplier and the electrical load is increasing, the dynamic regulator increases the input voltage, and 2) when the voltage indicative of current indicates that the current flowing between the multiplier and the electrical load is decreasing, the dynamic regulator decreases the input voltage.

Preferably, the regulator controller is responsive to the input voltage such that the increases and decreases of the input voltage also are dependent upon a present level of the input voltage.

According to a preferred embodiment of the regulator, as the low-voltage source becomes depleted, the regulator continues to provide the input voltage at progressively decreasing voltage levels, at least until the source voltage decreases to one half of the source voltage of a fully charged low-voltage source. A more preferred arrangement continues to provide the input voltage at progressively decreasing voltage levels, at least until the source voltage decreases to 20% of the source voltage of a fully charged low-voltage source.

Preferably, the DC voltage level is at least one thousand times the source voltage level, and according to a more preferred embodiment applicable to flat-screen CRT's, the DC voltage level is between 1440 and 1760 times the source voltage level.

Preferably, the regulator, DC-to-AC converter, and the multiplier are packaged together such that a profile of the power supply device is less than one half inch in thickness, and can be even less than 0.40 inch in thickness.

A preferred multiplier according to the present invention includes first and second capacitor arrays spaced apart from each other, each capacitor array defining a plurality of capacitors; a diode located on a surface of each capacitor; and a terminal assembly. The terminal assembly itself includes a first set of conductive leads arranged so as to electrically connect respective diodes on the first capacitor array to respective capacitors of the second capacitor array, and a second set of conductive leads arranged so as to electrically connect respective diodes on the second capacitor array to respective capacitors of the first capacitor array.

Preferably, the first and second capacitor arrays are substantially parallel to one another, and a diode is arranged on a top surface of each capacitor.

The terminal assembly further may include first and second ends, the conductive leads defining the first and second set of conductive leads being alternatingly arranged between the first and second ends. In addition, each conductive lead of the first and second set of conductive leads may include a substantially straight terminal and an oppositely arranged, downwardly projecting terminal.

Preferably, the downwardly projecting terminal is connected to one of the capacitors and the substantially straight terminal is connected to one of the diodes.

The first and second sets of conductive leads preferably are arranged within an electrically insulative body, and the first and second set of conductive leads have terminal portions over the capacitor arrays which extend out from the insulative body.

BRIEF DESCRIPTION OF THE DRAWINGS

FIG. 3A is a plan view of an alternative power supply device in accordance with the preferred embodiment illustrated in FIG. 2.

FIG. 8A schematically illustrates a nine-pin connector which is connected to the circuit illustrated in FIG. 8.

FIG. 10A is a schematic of the four pin connector illustrated in FIG. 11.

DESCRIPTION OF THE PREFERRED EMBODIMENTS

Figure 1:
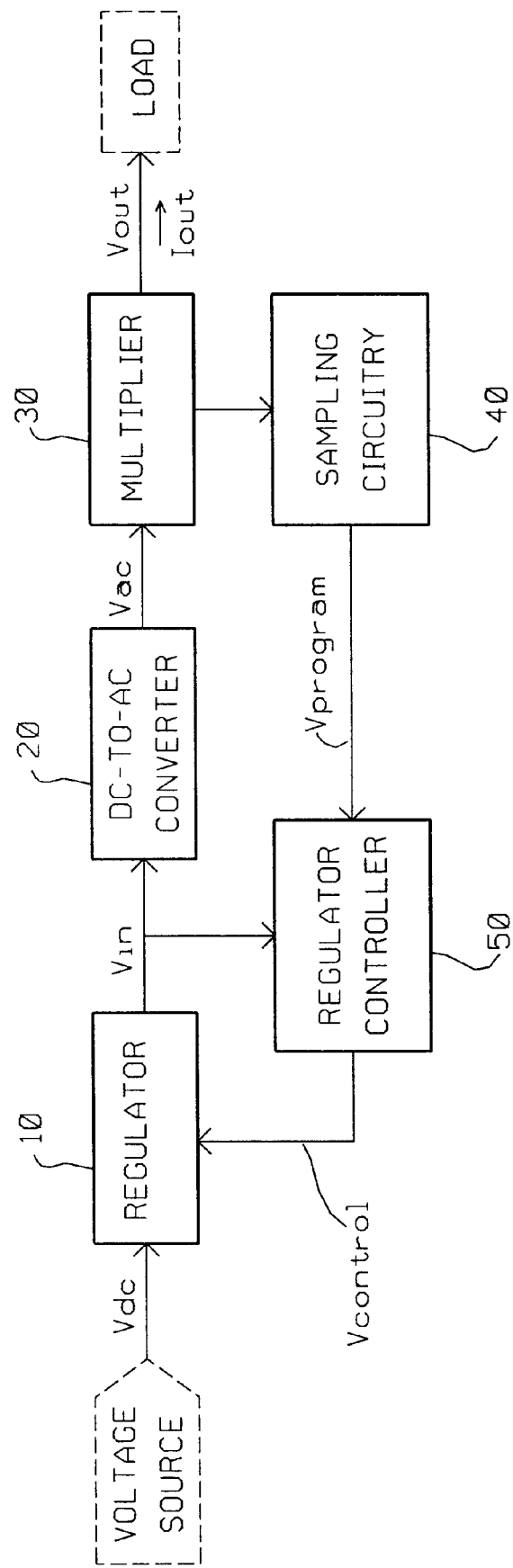
FIG. 1 is a block diagram illustrating a power supply device according to a preferred embodiment of the present invention.

With reference to FIG. 1, a power supply device according to a preferred embodiment of the present invention will now be described.

The illustrated power supply device includes a voltage regulator 10, a DC-to-AC converter 20 connected to the voltage regulator 10, and a multiplier 30 connected to the DC-to-AC converter 20. The multiplier 30 may be electrically connected to an apparatus (hereinafter "the load" or "the electrical load") which requires high-voltage power.

In operation, the voltage regulator 10 steps down a DC voltage $V_{DC}$ (from a voltage source such as a battery) to provide an input voltage $V_{IN}$ at a lower voltage level than $V_{DC}$. The input voltage $V_{IN}$ is then applied to the DC-to-AC converter 20. The DC-to-AC converter 20 converts the voltage $V_{IN}$ into an AC voltage $V_{AC}$ (for example, having a peak-to-peak voltage of 677 volts to 1333 volts and a frequency of about 85 kHz). The AC voltage $V_{AC}$ is then applied to the multiplier 30. The multiplier 30 converts the AC voltage $V_{AC}$ into a high-voltage output $V_{OUT}$ (for example, having a voltage level of 4,000 volts to 8,000 volts) which, in turn, can be applied to the load.

The current being drawn by the load is sampled by sampling circuitry 40. The sampling circuitry 40, in response to the current being drawn, provides a current-indicative voltage $V_{program}$ which is indicative of the current being drawn by the load. The current-indicative voltage $V_{program}$ is applied to a regulator controller 50. The regulator controller 50 is connected to the input voltage $V_{IN}$ and provides a control voltage $V_{control}$ at its output. The control voltage $V_{control}$ is applied to the regulator 10 at a level which is dependent upon both the input voltage $V_{IN}$ and the current-indicative voltage $V_{program}$. The regulator then adjusts the input voltage $V_{IN}$ in a manner dependent upon the control voltage $V_{control}$. The regulator 10 thereby provides dynamic voltage regulation in a manner dependent upon $V_{control}$. Such dynamic control advantageously prevents significant deviations in the high-voltage output $V_{OUT}$ which might otherwise occur when the current being drawn by the load changes.

If, for example, the current being drawn by the load increases, this increase in current is detected by the regulator controller 50 via the current-indicative voltage $V_{program}$. Upon detecting the increase, the regulator controller 50 adjusts the control voltage $V_{control}$ to cause an upward change in the voltage regulation provided by regulator 10. This, in turn, causes a corresponding increase in the input voltage $V_{IN}$.

As a result of this regulated increase in the input voltage $V_{IN}$, the combination of the DC-to-AC converter 20 and the multiplier 30 are able to maintain the desired high-voltage output $V_{OUT}$, even when the load connected thereto demands more current.

Similarly, if the current being drawn by the load decreases, this decrease is detected by the regulator controller 50 via the current-indicative voltage $V_{program}$. Upon detecting the decrease, the regulator controller 50 adjusts the control voltage $V_{control}$ to cause a downward change in the voltage regulation provided by regulator 10. This, in turn, causes a corresponding decrease in the input voltage $V_{IN}$.

As a result of this regulated decrease in the input voltage $V_{IN}$, the combination of the DC-to-AC converter 20 and the multiplier 30 are able to keep the high-voltage output $V_{OUT}$ from rising too far above the desired voltage level when the current being drawn by the load suddenly decreases.

The regulator controller 50 thereby achieves dynamic control of the regulator 10 in a manner dependent on the current being drawn by the load. Since the regulator controller 50 is responsive also to the input voltage $V_{IN}$, the dynamic control of the regulator 10 is dependent also upon the present input voltage $V_{IN}$.

In this regard, at different times, the control voltage $V_{control}$ can be at two different levels for the same amount of current being drawn by the load if the input voltage $V_{IN}$ at those times is at different levels. In the preferred embodiment of FIG. 2, for example, the current being drawn by the load can be at the same level in two different instances in time, and in one of those instances, the control voltage $V_{control}$ will be higher than in the other if the input voltage $V_{IN}$ is also higher. Such dynamic control of the regulator 10 advantageously provides a way of regulating the voltage $V_{IN}$ in a manner which is more accurate than arrangements which provide output regulation based only on the amount of current being drawn by the load.

The foregoing arrangement also achieves better efficiency than conventional voltage feedback loops because the latter usually cause a substantial power loss in the sensing network, whereas the arrangement described above performs the dynamic regulation control using a current-indicative voltage requiring very little power.

Figure 2:
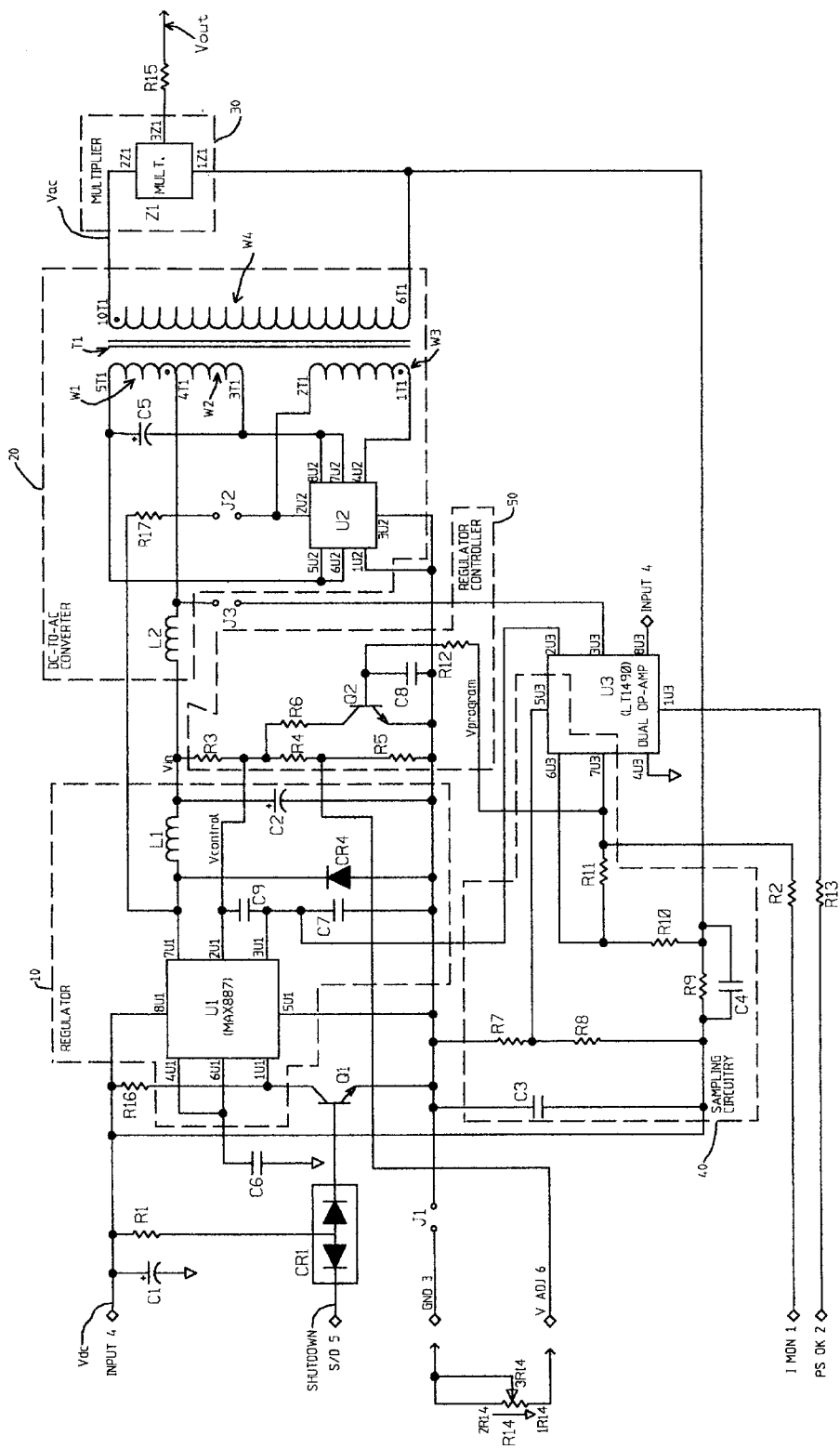
FIG. 2 is a circuit diagram illustrating a power supply device according to a preferred embodiment of the present invention.
Figure 3:
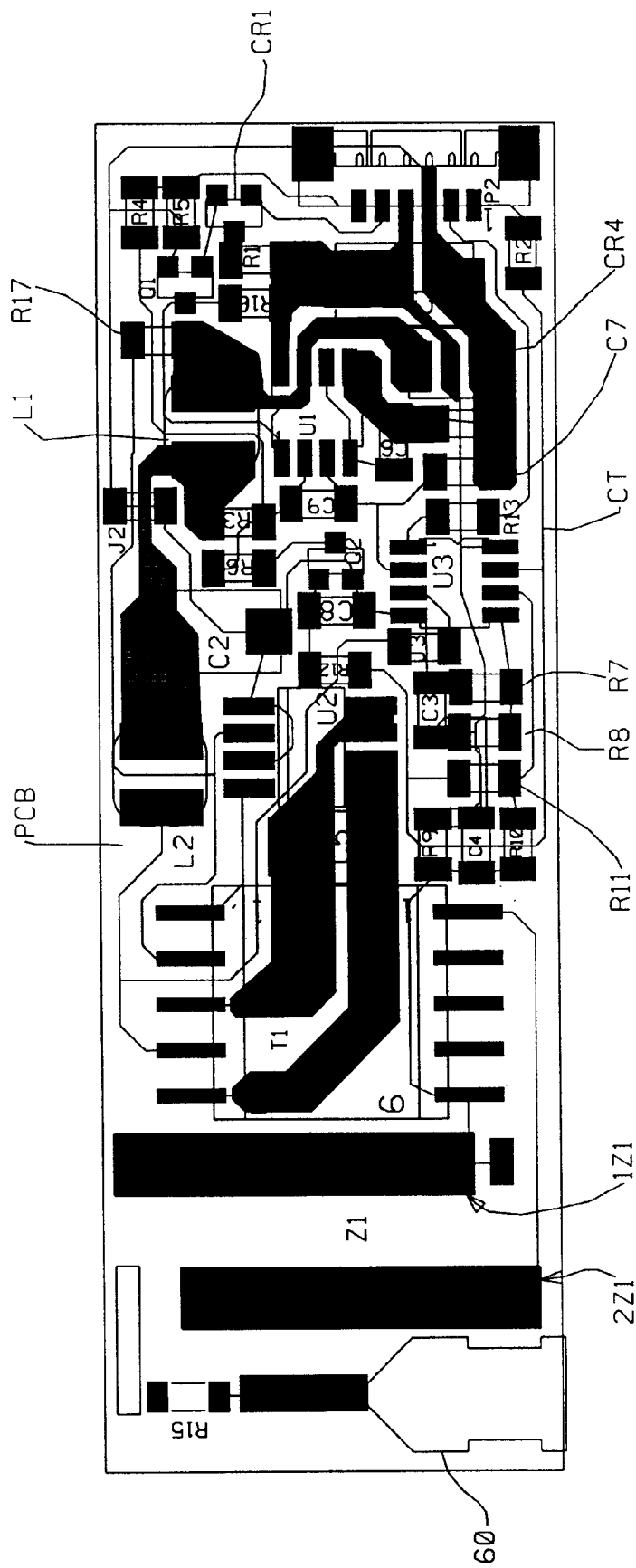
FIG. 3 is a plan view of a power supply device in accordance with the preferred embodiment illustrated in FIG. 2.

A preferred implementation of the embodiment illustrated in FIG. 1 is shown in FIGS. 2 and 3. The following chart provides details regarding the individual circuit elements shown in FIGS. 2 and 3:

| REF. No. | DESCRIPTION OF THE COMPONENT |
|---|---|
| U1 | DC/DC converter which serves as a voltage regulator. A preferred chip for use in achieving the DC/DC converter is the MAX887 controller IC chip commercially available from MAXIM Integrated Products Inc. The pins designated as pins 1–8 in the commercially available chip appear as pins 1U1, 2U1, 3U1, 4U1, 5U1, 6U1, 7U1 and 8U1, respectively. Other commercially available regulators may be used, so long as such regulators are high-efficiency synchronous switching regulators capable of operating up to 100% (or very close to 100%) duty cycle. The conversion frequency greater than 200 KHz is preferred to keep the size of the inductive and capacitive components as small as possible. In the preferred embodiment, the conversion frequency is 300 KHz. |
| U2 | NPN dual transistor chip manufactured by ZETEC and commercially available under part number ZDT1048. This chip forms part of the DC-to-AC conversion circuitry and provides on/off switching at a frequency which provides resonance with capacitor C5 and the inductance of transformer T1, and generates a sinusoidal signal at the transformer's secondary winding. The pins designated as pins 1–8 in the commercial chip appear in the drawings as pins 1U2, 2U2, 3U2, 4U2, 5U2, 6U2, 7U2 and 8U2, respectively. |
| U3 | ICL dual operational amplifier (dual op-amp) commercially available from Linear Technology under part number LT 1490. This particular dual op-amp has a low quiescent current, preferably less than 50 micro amps. The output pins 1–8 of the LT 1490 dual op-amp appear in the drawing as pins 1U3, 2U3, 3U3, 4U3, 5U3, 6U3, 7U3 and 8U3, respectively. |
| Z1 | voltage multiplier |
| T1 | transformer commercially available from Toko under part number 678XN-1081 and having a maximum thickness of 5.1 millimeters. This transformer is preferred over other transformers having similar electrical characteristics primarily because of its compact size. |
| CR1 | dual diodes in one package which provide a shut-down enable function. To put the DC/DC converter U1 into a sleep mode, a voltage is applied at the S/D (shut-down) terminal. When this happens, the dual diodes CR1 cause the transistor Q1 to become conductive such that the terminal 1U1 of the DC/DC converter U1 is grounded. As a result, the DC/DC converter U1 enters a sleep mode wherein the input voltage $V_{IN}$ is no longer applied. This permits the high-voltage output to be shut-down while, at the same time, permitting any monitoring or indication functions to continue via, for example, terminals 1 MON 1 or PS OK 2. |
| CR4 | low forward voltage Schottky diode, preferably, a commercially available SK13 Schottky diode. |
| R1, R2, R8, R10, R13 | 110 kΩ +/– 5% resistor having a power rating of ⅛ Watt and a 1206 surface-mount configuration. |
| R3 | 22 kΩ +/– 1% resistor having a power rating of ¼ Watt and a 1206 surface-mount configuration. |
| R4 | 11 kΩ +/– 1% resistor having a power rating of ¼ Watt and a 1206 surface-mount configuration. |
| R5 | 93.1 kΩ +/– 1% resistor having a power rating of ¼ Watt and a 1206 surface-mount configuration. |
| R6 | 42.2 kΩ +/– 1% resistor having a power rating of ⅛ Watt and a 1206 surface-mount configuration. |
| R7, R11 R15 | 220 kΩ +/– 5% resistor having a power rating of ⅛ Watt and a 1206 surface-mount configuration. |
| R9 | 4.99 kΩ +/– 1% resistor having a power rating of ¼ Watt and a 1206 surface-mount configuration. |
| R12 | 4.3 MΩ +/– 1% resistor having a power rating of ¼ Watt and a 1206 surface-mount configuration. |
| R14 | 100 kΩ potentiometer having two stationary terminals 1R14 and 2R14 on opposite sides of a resistance and a variable resistance terminal 3R14 therebetween. By adjusting the variable resistance, the high-voltage output $V_{OUT}$ can be adjusted between 4,000 volts and 8,000 volts. |
| R16 | 100 kΩ +/– 5% resistor having a power rating of ⅛ Watt and a 1206 surface-mount configuration. |
| R17 | 3.48 kΩ +/– 1% resistor having a power rating of ¼ Watt and a 1206 surface-mount configuration. |
| C1, C2 | 100 μFarad, 10 V rated, electrolytic tantalum filtering capacitors, preferably having low equivalence series resistance (ESR). |
| C3 | 0.01 μFarad ceramic capacitor having a 50 volt rating and a 1206 surface-mount configuration. Preferably, the capacitor has an X7R temperature coefficient. |
| C4 | 1 μFarad ceramic capacitor having a 20 volt rating and a 3216 surface-mount configuration. |
| C5 | 0.1 μFarad ceramic capacitor having a 25 volt rating which serves as the capacitive element in providing resonance within the DC-to-AC converter's oscillator portion. Capacitor C5 preferably is a low loss capacitor (Low A/C equivalent resistance) to provide maximum conversion efficiency. |
| C6 | 2.2 μFarad, 10 volt rated, tantalum, surface-mount capacitor. |
| C7 | 0.047 μFarad ceramic capacitor having a 50 volt rating and a 1206 surface-mount configuration. Preferably, the capacitor has an X7R temperature coefficient. |
| C8 | 0.1 μFarad ceramic capacitor having a 50 volt rating and a 1206 surface-mount configuration. Preferably, the capacitor has an X7R temperature coefficient. |
| C9 | 6.8 nanoFarad +/– 10% ceramic capacitor having a 50 volt rating and a 1206 surface-mount configuration. |
| Q1 | transistor chip MMBT 4401 has a surface-mount configuration and provides a turn off function for the MAX887 chip, by inverting its input. |
| Q2 | transistor chip MMBT 4401 has a surface-mount configuration and serves as a dynamic impedance which dynamically varies in response to the current-indicative voltage $V_{program}$ and thereby achieves the current-responsive aspect of the control voltage $V_{control}$. As the impedance of the transistor chip Q2 varies, the voltage at the node between resistor R3 and resistor R4 varies. Because a voltage divider network is defined by the combination of resistors R3, R4, R5 and R6, as well |

-continued

| REF. No. | DESCRIPTION OF THE COMPONENT |
|---|---|
| | as the dynamic impedance of transistor chip Q2, the variation in voltage at the node between resistors R3 and R4 (i.e., the variation in $V_{control}$) is dependent upon both the current-indicative voltage $V_{program}$ and the input voltage $V_{IN}$. $V_{IN}$ therefore is regulated by the regulator 10 in a manner dependent upon $V_{IN}$ itself and the current-indicative voltage $V_{program}$. |
| 60 | high-voltage, surface-mount connector for the high-voltage output from the multiplier Z1. Preferably, the connector is a male, one-pin connector. |
| P2 | six-pin connector having a 0.050" pin spacing and designed for surface-mounting on a printed circuit board. |
| L1, L2 | 47 µH surface-mount inductors which are small in size and have a low resistance and high saturation current. |
| J1, J2, J3 | conductive jumpers physically located in the circuit at locations where conductive traces on the circuit board cross-over one another but should not make electrical contact. |

As illustrated in FIG. 3, the aforementioned circuit components preferably are mounted on a printed circuit board PCB made at least partially of fiberglass and having a high dielectric strength. The illustrated printed circuit board PCB has a thickness of about 0.093 inch, and includes conductive traces CT which interconnect the circuit components so as to define the circuit illustrated in FIG. 2.

Figure 2A:
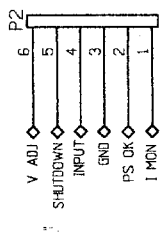
FIG. 2A schematically illustrates a six-pin connector which is connected to the circuit illustrated in FIG. 2.

At one end of the circuit board PCB, the six-pin connector P2 is mounted. The six-pin connector P2, shown in FIG. 2A, includes a 1MON1 pin, a PS OK pin, a GND3 pin, an INPUT4 pin, a SHUTDOWN5 pin, and a VADJ6 pin. The source voltage $V_{DC}$ appears at the INPUT4 pin of connector P2 and is applied across the ground pin GND3 (−) and the INPUT4 pin (+). The potentiometer R14 may be electrically connected across the VADJ6 pin and the ground pin GND3. The SHUTDOWN5 pin is connected to the S/D terminal. The PS OK and 1MON1 pins are connected to appropriate monitoring and/or indicating devices.

At an opposite end of the circuit board PCB, the high-voltage connector 60 is connected to the resistor 15. The high-voltage connector 60 therefore is used to connect the circuit board PCB to the electrical load, such as a flat screen CRT.

The current flowing from the multiplier Z1 through the resistor R15 and the load, returns to the multiplier Z1 by flowing through ground, through the source voltage and the INPUT4 pin, then through the resistor R9 and back to the multiplier Z1.

Preferably, the circuit board PCB illustrated in FIG. 3 is less than three inches long and has a width no greater than one inch. The illustrated circuit board PCP has a preferred length of about 2.95 inches and a preferred width of about one inch. It is understood, however, that other dimensions can be provided depending on the needs of an end user of the power supply device.

An alternative arrangement for the components in FIG. 3 which are to the right of the transformer T1 is illustrated in FIG. 3A.

The dual op-amp U3 shown in FIG. 1 (the LT 1490 manufactured by Linear Technology) achieves two functions, a monitoring function and a control function. With regard to the monitoring function, the dual op-amp U3 monitors the input voltage $V_{IN}$ being applied to the DC-to-AC converter 20 and provides a PS OK (power supply OK) voltage to a PS OK terminal when the input voltage $V_{IN}$ is present. This permits an external indicator and/or monitoring device to indicate and/or record whether the power supply is operating. An indicator light or LED, for example, can be connected to the PS OK terminal so that the indicator light or LED is illuminated whenever the PS OK voltage is present. This provides a simple and effective warning device indicating the presence of a high voltage at the output from the power supply device.

As illustrated in FIG. 2, the monitoring function is provided by connecting the pins 2U3 and 3U3 of the dual op-amp U3 to the 3U1 pin of the DC/DC converter U1 and to the DC-to-AC converter side of the inductor L2, respectively. In addition, the output pin 1U1 of the dual op-amp U3 is connected via the resistor R13 to the PS OK terminal of the power supply.

The second function achieved by the dual op-amp U3 relates to providing control of the dynamic regulation. In particular, the dual op-amp U3 is responsive to the current flowing between the multiplier 30 and the electrical load. Since this current flows through the resistor R9, the dual op-amp U3 detects a voltage drop across the resistor R9. Based upon this current-indicative voltage drop, the dual op-amp U3 provides an output voltage at its output terminal 7U3. This output voltage corresponds to the current-indicative voltage $V_{program}$ and therefore is applied to the regulator controller 50. The regulator controller 50 then uses this current-indicative voltage $V_{program}$ to provide dynamic control of the regulator 10, as indicated above.

Such indirect, dynamic regulation of the output voltage based, in part, on the current being drawn by the load provides a regulation arrangement of increased efficiency compared to arrangements which feedback electrical voltage from the high-voltage output.

In the embodiment of FIG. 2, the control function of the dual op-amp U3 is achieved by connecting the 5U3 pin of the dual op-amp U3 between resistors R7 and R2, by connecting the 6U3 pin between resistors R10 and R11, and by connecting the 7U3 pin of the dual op-amp U3 to the regulator controller 50. The voltage drop across resistor R9 therefore is detected via the 5U3 and 6U3 pins of the dual op-amp U3, and the current-indicative voltage $V_{program}$ is supplied via the 7U3 pin.

The resistances R7, RB, R9, R10 and R11 are selected to provide a desired scaling factor required for $V_{program}$ based on the multiplier's dynamic performance. The multiplier's dynamic performance is determined primarily by the number of multiplier stages, the per-stage capacitances, and the frequency of the AC signal.

Since the DC source voltages may vary between 4.5 volts and 5.5 volts, the DC/DC converter of the regulator 10 regulates the source voltage down to approximately 3 volts, and thereby provides a more stable input voltage $V_{IN}$. Preferably, the DC/DC converter has a high conversion frequency (preferably greater than 200 KHz) and a 100% (or very close to 100%) duty cycle. The DC/DC converter, therefore, does not suddenly shut down like other converters when the source voltage (e.g., battery) drops below a certain value which is significantly higher than one volt. This advantageously increases the usable operating time in portable applications of the power supply device.

The transformer T1 illustrated in FIGS. 2 and 3 has primary windings W1, W2, and W3 and a secondary winding W4. In the preferred transformer T1 commercially available from Toko, the numbers of turns in the windings W1, W2, W3 and W4 are six, six, three, and eight-hundred, respectively.

The primary winding W1 extends electrically between terminals 5T1 and 4T1 and has an inductance of 6.85 $\mu$H, +/−15%, at 0.1 volt and 10 kHz. Winding W1 has a resistance of no more than 110 m$\Omega$.

The primary winding W2 extends electrically between terminals 4T1 and 3T1 and exhibits the same inductance as winding W1. The resistance of winding W2, however, is no more than 125 m$\Omega$.

The primary winding W3 extends electrically between terminals 2T1 and 1T1 and has an inductance of 1.73 $\mu$H, +/−15%, at 0.1 volt and 10 kHz. Winding W3 has a resistance of no more than 202 m$\Omega$.

The secondary winding W4 extends electrically between terminals 10T1 and 6T1 and has an inductance of 114 mH at 0.1 volt and 10 kHz. Winding W3 has a resistance of 331 $\Omega$, +/−20%.

Advantageously, the sampling circuitry 40 provided by the embodiment illustrated in FIG. 2 draws 25 microwatts of power at the full output load current, less than 0.003% of the power being transmitted to the load by the multiplier. By keeping the amount of power drawn by the sampling circuitry to such low levels, the illustrated embodiment enhances the overall efficiency of the system in a manner which is significantly better than arrangements wherein current from the output loop is fed back into a voltage regulator and advantageously does not lo require a high-voltage-rated/high ohmic value output sensing resistor.

The exemplary embodiment shown in FIG. 2 can be manufactured using surface-mount components on a printed circuit board. The components and the circuit board advantageously can be arranged so that the overall thickness of the power supply device is less than 0.5 inch. Preferably, the components and circuit board are arranged to have a thickness of less than 0.4 inch, a length of no more than 2.5 inches and a width of no more than one inch. Such dimensions make the exemplary embodiment compatible with the limited space in flat screen CRTs.

After manufacturing, the components of the circuit illustrated in FIG. 2 and the circuit board preferably are encapsulated using a known encapsulation technique. A preferred encapsulation technique utilizes a two part heat cure and a material which is commercially available from Dow Chemical and commonly known as "SYLGUARD".

Modifications to the circuit illustrated in FIG. 2 will become readily apparent to those of ordinary skill in the art based on the teachings in the present disclosure. Even more modifications will become readily apparent as smaller and more compact circuit elements capable of achieving the functions carried out by the circuit illustrated in FIG. 2 become available. In this regard, the present invention is not limited to the exemplary circuit illustrated in the drawings, but rather encompasses the full range of modifications which fall within the scope of the appended claims.

The illustrated circuitry can be manufactured using automated manufacturing techniques. In addition, the illustrated circuitry is powered by a 5 volt source (e.g., a battery, or battery pack) and provides an output voltage of about 8,000 volts. This voltage conversion is advantageously provided with a power efficiency of at least 75% (when delivering only 1.25 watts). In addition, the "no-load" or quiescent dissipation of the circuitry is no more than 0.1 Watt, measured at zero output loading.

A significant advantage of the illustrated circuitry is that the high-voltage output power does not terminate immediately as the 5 volt input power diminishes. Instead, the output power gradually decreases until the input voltage is very close to zero (e.g. at 1 volt or less). Also, the illustrated circuitry is able to withstand, without damage, repeated momentary external short circuits of the high-voltage output $V_{OUT}$ and ground.

Thus, when the illustrated circuitry is used to apply high-voltage power to a flat screen CRT, the display gradually looses intensity as the low voltage input power diminishes, thereby warning the user of the eventual loss in power and also preventing sudden loss of display. This also extends the usable time of the display.

Figure 4:
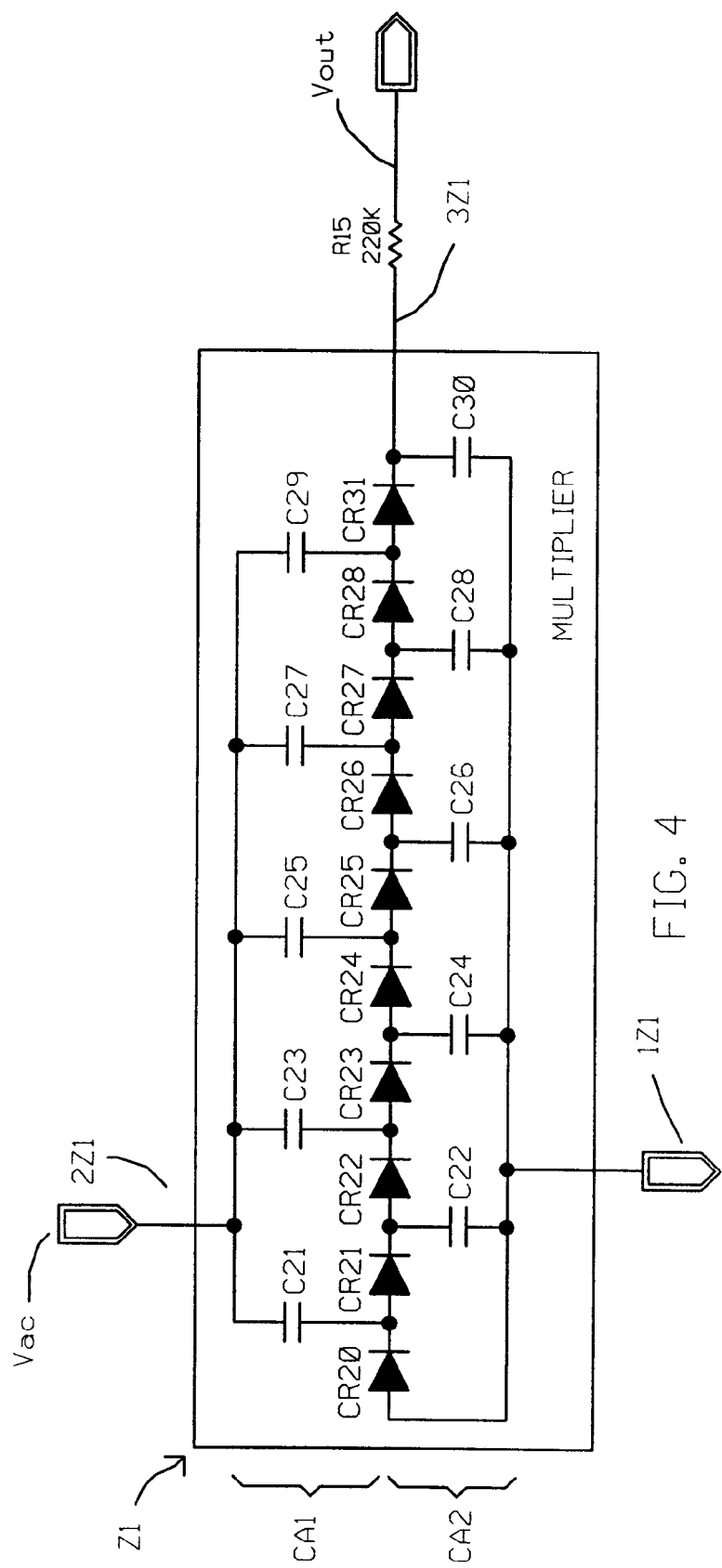
FIG. 4 is a circuit diagram of a multiplier in accordance with a preferred embodiment of the circuitry illustrated in FIG. 2.

Preferably, as illustrated in FIG. 4, the multiplier Z1 is defined by an assembly of capacitors C21, C22, C23, C24, C25, C26, C27, C28, C29, C30 and diodes D20, D21, D22, D23, D24, D25, D26, D27, D28, D31 which are interconnected to form a voltage multiplier. In order to achieve a high-voltage output $V_{OUT}$ of about 8,000 volts, the capacitors C21–C30 preferably have capacitances as high as physical space permits. To achieve the greatest size reduction and maintain acceptable electrical performance, C21–C30 preferably have capacitances of 75 pFarad to 150 pFarad. Also, because of the monolithic construction of the capacitor assemblies, preferably all of the capacitors are rated for the full output voltage. This tends to enhance reliability.

The resulting arrangement of capacitors converts the AC voltage $V_{AC}$ provided by the DC-to-AC converter 20 to a DC high-voltage output of about 8,000 volts.

Figure 5:
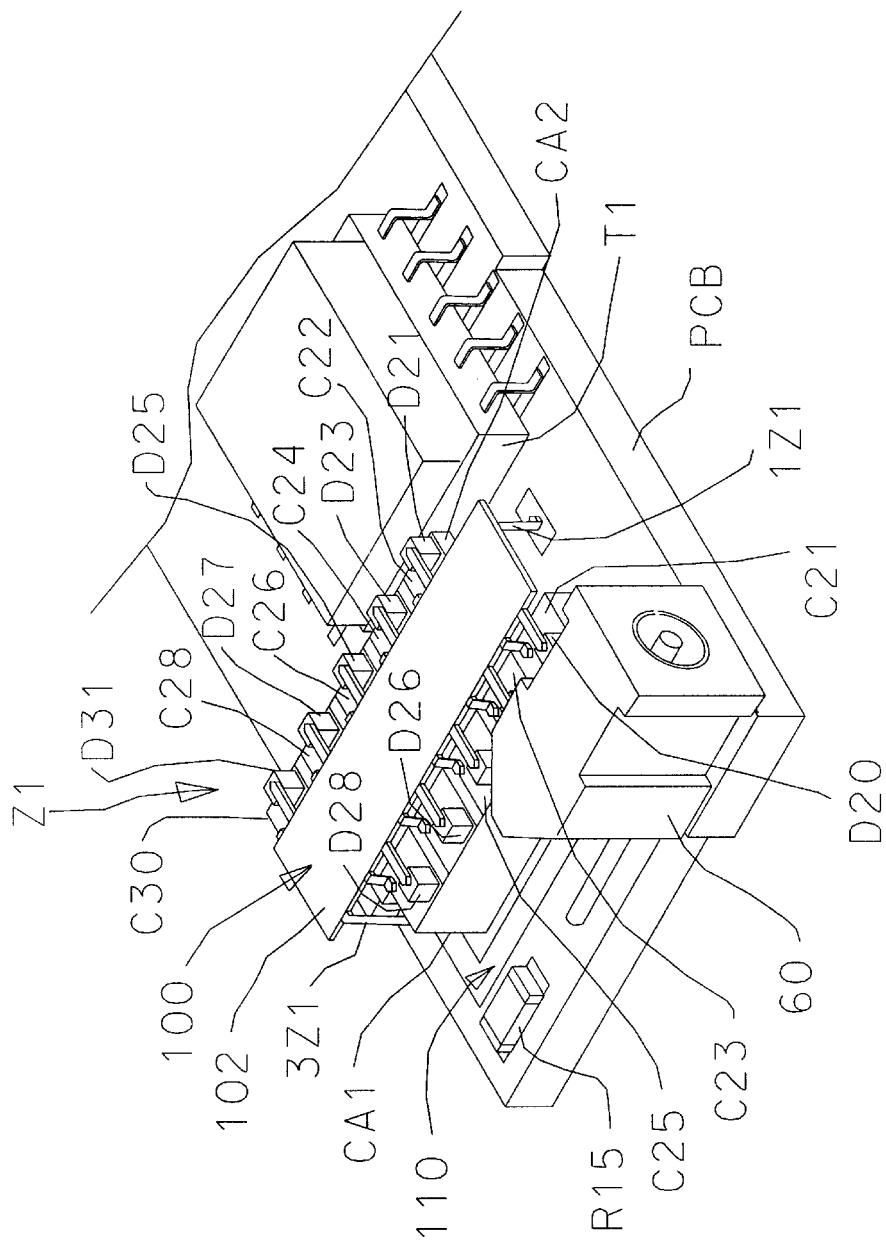
FIG. 5 is a perspective view of a preferred multiplier in accordance with the embodiment illustrated in FIG. 4.

With reference to FIG. 5, a preferred physical embodiment of the multiplier Z1 is defined by two monolithic capacitor arrays CA1, CA2 arranged spatially in parallel to one another and spaced apart from each other, a chip diode D20–D31 located on a top surface of each capacitor C21–C30 in each capacitor array CA1, CA2, and a molded terminal assembly 100 containing conductive leads which interconnect the capacitor arrays CA1, CA2 and the diodes D20–D31 such that the voltage multiplier circuit illustrated in FIG. 4 is achieved. In FIG. 3, the location of each capacitor array CA1, CA2 is apparent from the elongated parallel traces on the left side of the drawing.

The chip diodes D20–D31 are commercially available, as are the monolithic blocks which define the capacitor arrays CA1, CA2. Each capacitor array CA1, CA2 is defined by a ceramic block, preferably less than 0.150 inch in height, having a metalized bottom surface connected to the conductive traces CT of the circuit board PCB and also having a metalized top surface. The top surface has parallel lines of the metalization removed or etched away to define an electrically insulative space between the top plates of the individual capacitors. Preferably, the insulative space is about 0.025 inch wide and each of the top plates of the capacitors is about 0.110 inch wide from one gap to the next.

The illustrated interconnection of chip diodes D20–D31 and capacitor arrays CA1, CA2 may be achieved using conventional surface-mount soldering techniques, or using conductive epoxy. The capacitor arrays CA1, CA2 may be connected to the circuit board and its associated conductive traces CT using similar techniques.

Figure 5C:
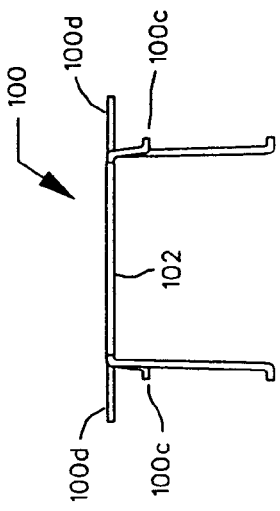
FIGS. 5B and 5C are orthogonal side views of the molded terminal assembly shown in FIG. 5A.
Figure 5A:
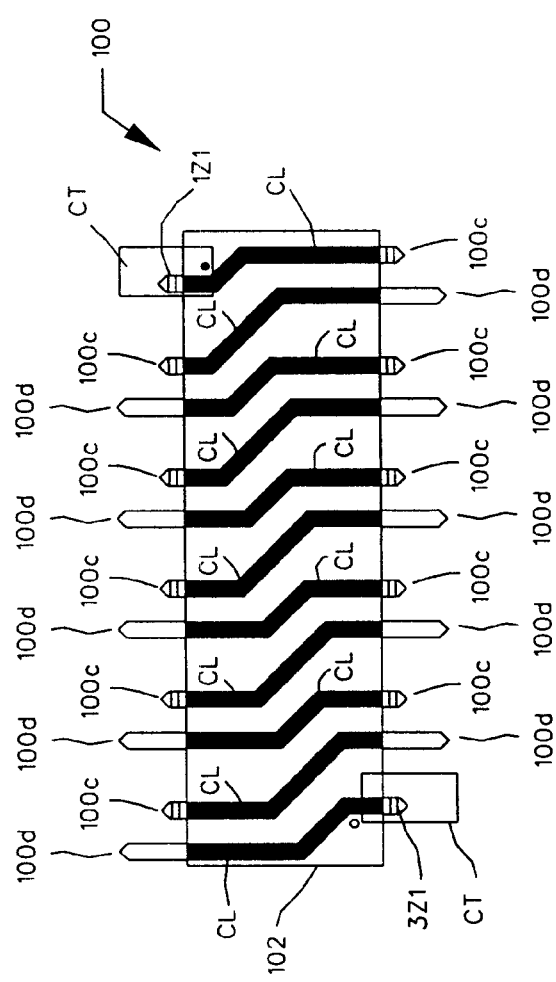
FIG. 5A is a top view of preferred molded terminal assembly for the multiplier shown in FIG. 5.
Figure 5B:
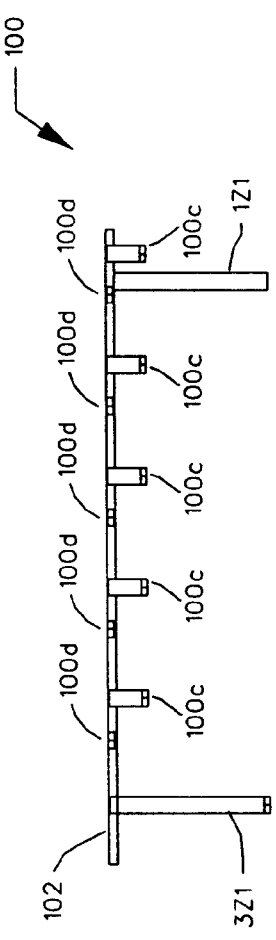

As illustrated in FIGS. 5A–5C, the molded terminal assembly 100 interconnects the components of or on the capacitor array CA1 with components of or on the capacitor array CA2. In particular, the straight-projecting terminals 100d are connected to the tops of the diodes, the short, downwardly extending terminals 100c are connected to respective top plates of the capacitors, and the long, downwardly extending terminals of the molded terminal assembly 100 serve as the 1Z1 and 3Z1 terminals of the multiplier Z1.

Except for the terminal 100c connected by a conductive lead CL to the 1Z1 multiplier terminal and the terminal 100d connected by another conductive lead CL to the 3Z1 multiplier terminal, each of the terminals 100d is connected by a respective conductive lead CL to one of the terminals 100c located on an opposite side of the rectangular body 102. The conductive leads CL may be defined by conductive foil, metal deposition, and the like. The connection of the various terminals to the circuit components may be achieved using conventional soldering techniques, conductive epoxy, or the like.

Preferably, the substantially rectangular body 102 of the molded terminal assembly is defined by molded "KAPTON". It is understood, however, that other electrically insulative materials can be used to form the rectangular body 102, so long as such materials are mechanically and dielectrically strong.

Preferably, the rectangular body 102 is less than one inch long, the illustrated body 102 having a length of about 0.90 inch. The short, downwardly extending terminals 100c preferably extend down a distance of about 0.04 inch to the top of the capacitors, while the long, downwardly extending terminals of the molded terminal assembly 100 extend down a distance of about 0.19 inch.

The terminals 10c, 1Z1 and 3Z1 preferably extend laterally out from the rectangular body 102 for a distance of about 0.03 inch, while the terminals 100d extend laterally out from the rectangular body 102 for a distance of about 0.08 inch. The preferred rectangular body 102 is less than ¼ of an inch wide, preferably about 0.23 inch wide.

With reference to FIG. 5, since a high-voltage is achieved at the left-most end of the multiplier Z1, the spacing between circuit elements must be such that no short circuits occur. Additional insulation and smaller spacing may be provided by encapsulating the multiplier assembly in a strong insulative material.

In addition, as illustrated in FIG. 5, a gap 110 may be formed in the circuit board PCB, which gap 110 extends between the capacitor array CA1 and the high-voltage trace extending from the 3Z1 terminal to resistor R15 and then to the connector 60. The gap 110 also may extend between the capacitor arrays CA1, CA2, for a distance corresponding to the high voltage portions of the capacitor arrays CA1, CA2. The additional insulation described above may be applied so as to fill the void defined by the gap 110.

Figure 6:
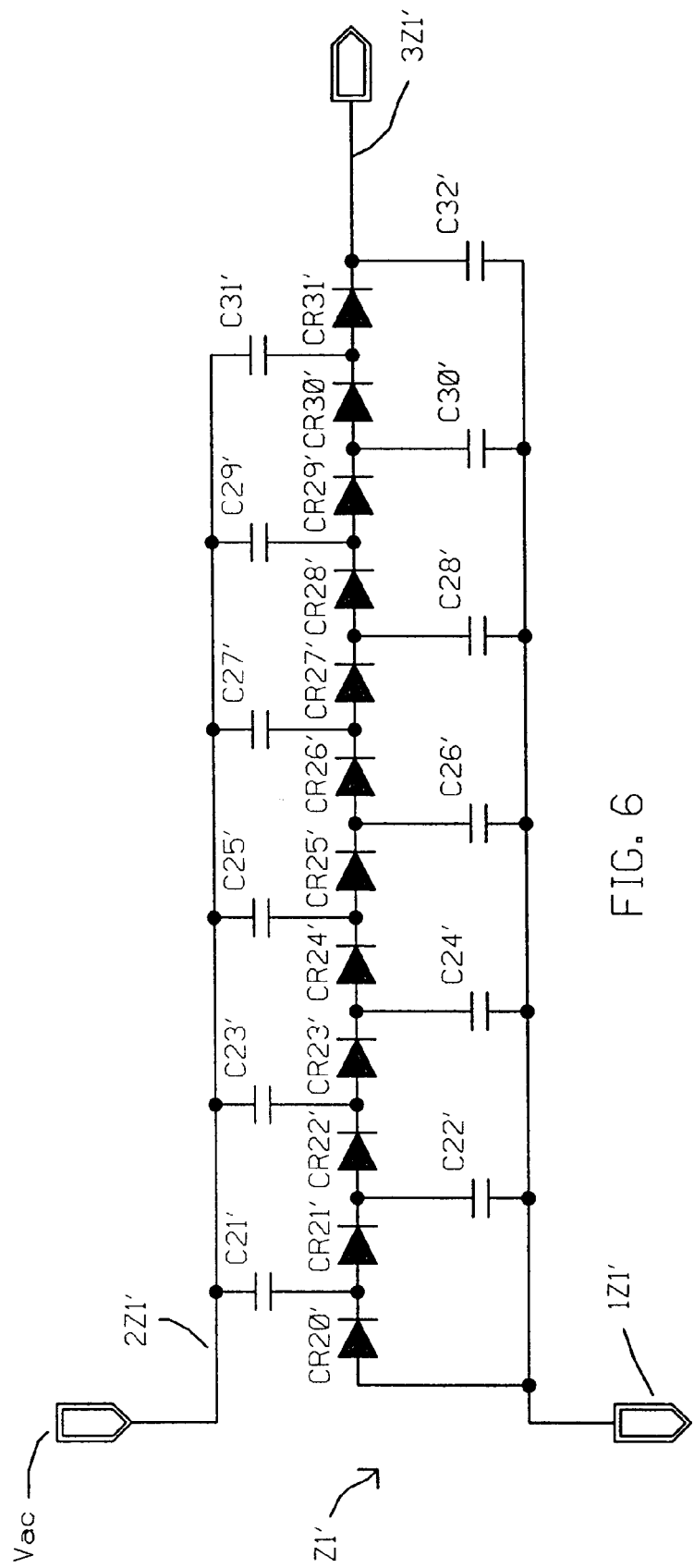
FIG. 6 is a circuit diagram of an alternative multiplier for the circuitry illustrated in FIG. 2.

As illustrated in FIG. 6, an alternative multiplier Z1' can be constructed using two additional diodes and two additional capacitors. In particular, the multiplier Z1' is defined by an assembly of capacitors C21', C22', C23', C2', C25', C26', C27', C28', C29', C30', C31', C32' and diodes CR20', CR21', CR22', CR23', CR24', CR25', CR26', CR27', CR28', CR29', CR30', CR31' which are interconnected to form a voltage multiplier. Additional diodes and capacitors can be added or removed to develop a higher or lower output voltage for different applications.

In order to achieve a high-voltage output $V_{OUT}$, of about 8,000 volts, the capacitors C21'–C32' preferably have capacitances which provide acceptable ripple at the output and minimize voltage regulation requirements. Typical values for 8,000 volts are between 75 pFarad and 150 pFarad for the ceramic monolithic capacitor banks, with one common plate (parallel configuration). Generally, when the voltage rating is higher, the capacitance is lower for the same size "block" due zo increased thickness of the dielectric.

Structurally, the alternative multiplier Z1' can be defined by an arrangement similar to that of FIGS. 5 and 5A–5C, except that an additional course of conductive lead pairs is provided in the rectangular body 102, as well as an additional capacitor for each capacitor array CA1, CA2.

Alternatively, the circuit board can be constructed using a ceramic material and the multiplier Z1 can be arranged so that the capacitive elements thereof are defined, in part, by the ceramic material of the circuit board. In particular, the ceramic material of the circuit board could be used as the dielectric which separates conductive capacitor plates defined by a conductive film or foil on the top surface of the circuit board from conductive parallel strips located on the bottom surface of the ceramic circuit board. The parallel strips on the bottom can be electrically connected to the transformer T1 using, for example, conductive traces which extend around an edge of the circuit board toward the appropriate terminals of the transformer T1. The diodes therefore would be located on the top surface of the conductive film or foil, thereby providing a surface mounting arrangement for the diodes of the multiplier.

The foregoing alternative arrangements, of course, are only examples of the many modifications which can be made to the preferred embodiment without departing from the scope and spirit of the present invention.

Still other examples of such modifications include, among other things, alternative circuitry for replacing the circuitry illustrated in FIG. 2.

Figure 7:
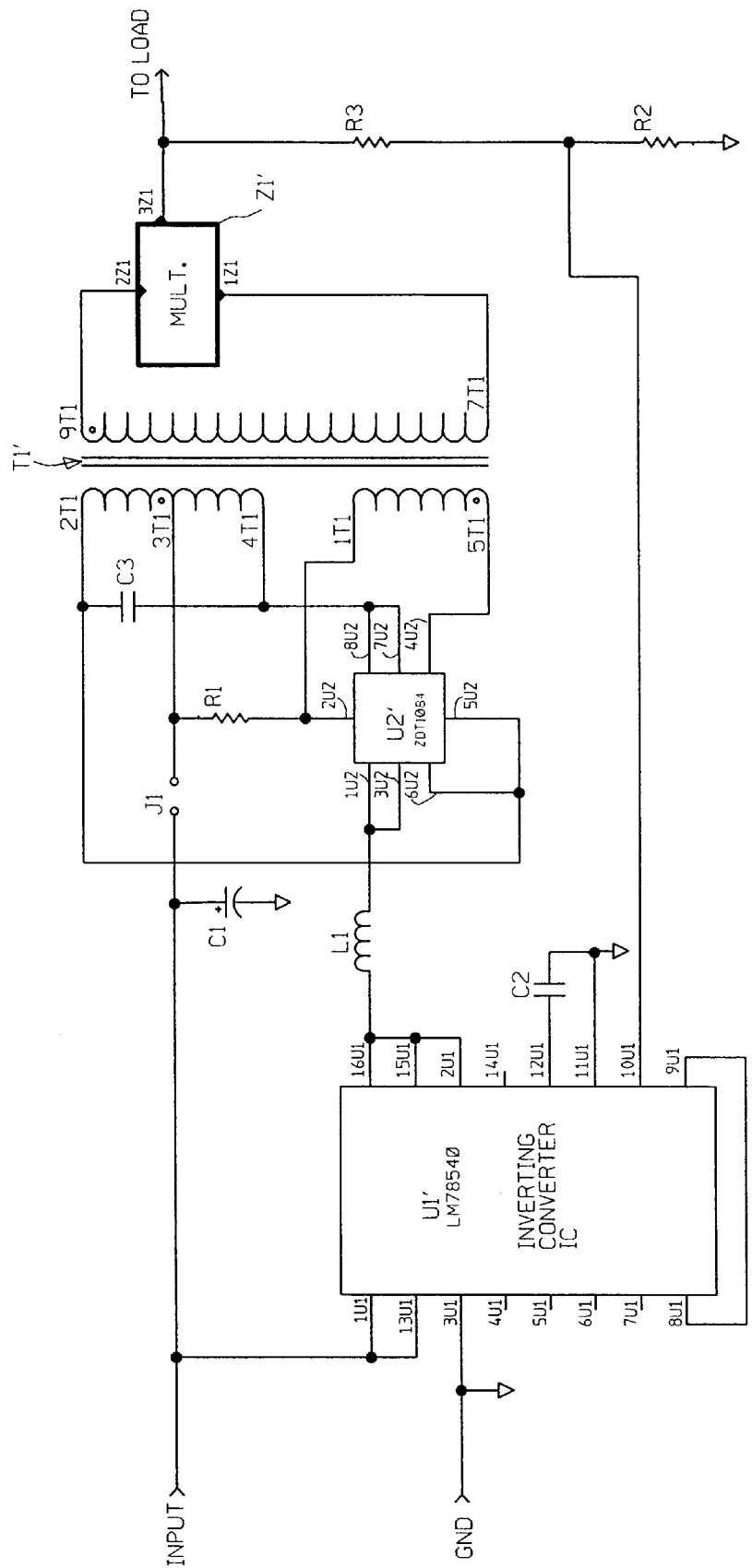
FIG. 7 is a circuit diagram of an alternative circuit according to the present invention.

Although not all of the alternative circuitry may achieve all of the objects of the invention, at least some of the objects are achieved by the alternative circuitry. An example of such alternative circuitry is illustrated in FIG. 7. The following chart describes the various circuit elements shown in FIG. 7.

| REF. No. | DESCRIPTION OF THE COMPONENT |
| --- | --- |
| U1' | Inverting converter IC which is commercially available from Motorola under part number LM78S40. The pins designated as pins 1–16 in the commercially available chip appear as pins 1U1, 2U1, 3U1, 4U1, 5U1, 6U1, 7U1, 8U1, 9U1, 10U1, 11U1, 12U1, 13U1, 14U1, 15U1 and 16U1, respectively. |
| U2' | NPN dual transistor chip manufactured by ZETEC and commercially available under part number ZDT1048. This chip forms part of the DC-to-AC conversion circuitry and provides on/off switching at a frequency which provides resonance with capacitor C3' and the inductance of transformer T1', and generates a sinusoidal signal at the transformer's secondary winding. The pins designated as pins 1–8 in the commercial chip appear in the drawings as pins 1U2, 2U2, 3U2, 4U2, 5U2, 6U2, 7U2 and 8U2, respectively. |
| Z1 | voltage multiplier |
| T1' | transformer commercially available from Coiltronics under part number CTX 110659 and having a thin profile and electrical characteristics similar to that of transformer T1. This particular transformer, however, has a larger "footprint" than the transformer used in the circuitry of FIG. 2. The pins 1–5, 7 and 9 of the commercially available transformer appear in the drawings as 1T1, 2T1, 3T1, 4T1, 5T1, 7T1 and 9T1, respectively. |
| R1 | 10 kΩ resistor. |
| R2 | 78.1 kΩ resistor. |
| R3 | 500 MΩ resistor (e.g., a thick film resistor). |
| C1 | 220 μFarad, 10 V rated capacitor |
| C2 | 0.01 μFarad capacitor. |
| C3 | (optional capacitor) |
| L1 | 82 μH surface mount inductors which are small in size and have a low resistance and high saturation current. |

-continued

| REF. No. | DESCRIPTION OF THE COMPONENT |
|---|---|
| J1 | conductive jumper physically located in the circuit at locations where conductive traces on the circuit board cross-over one another but should not make electrical contact. |

Although the circuitry illustrated in FIG. 7 is generally effective, it does not provide the low-power, indirect dynamic voltage regulation control provided by the circuitry of FIG. 2.

Figure 8:
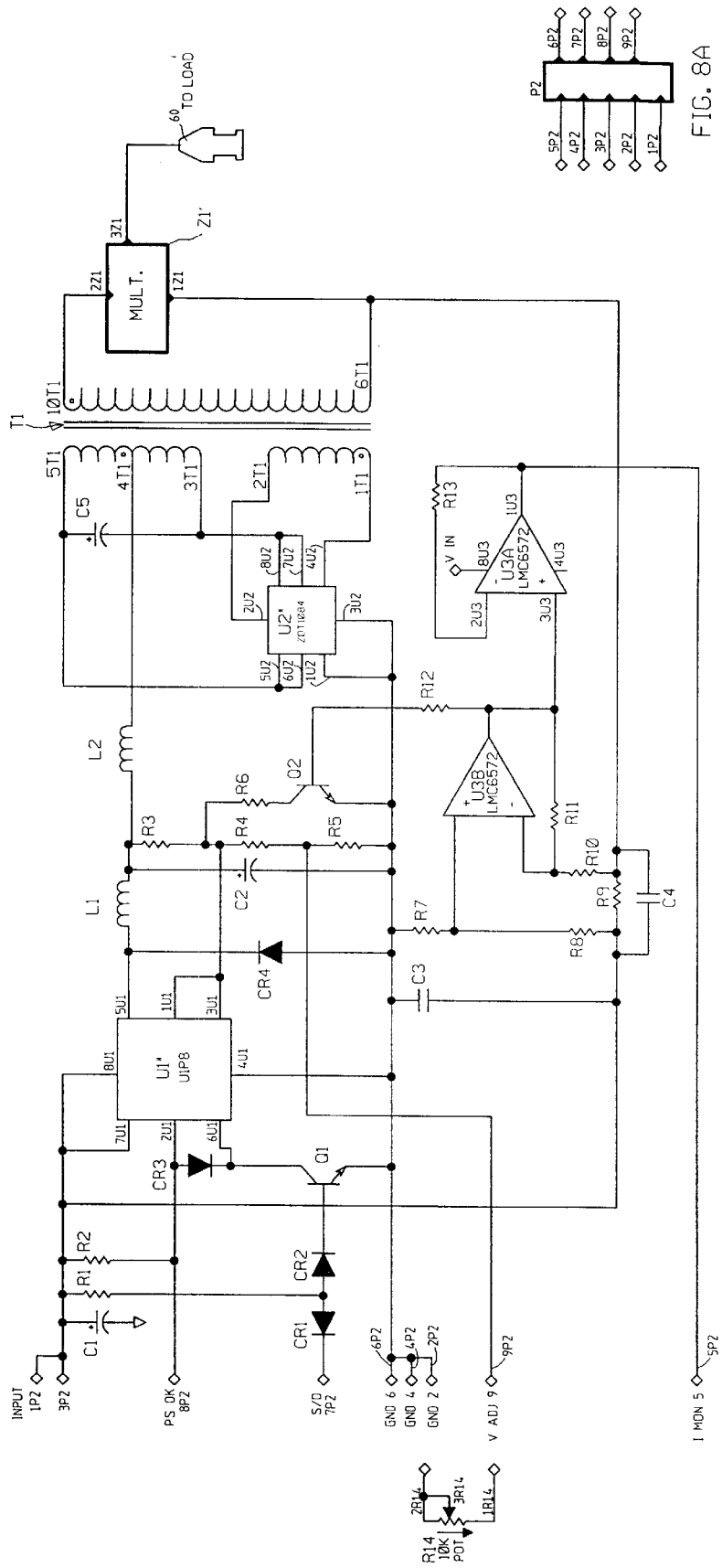
FIG. 8 is a circuit diagram of yet another alternative circuit according to the present invention.

Yet another example of alternative circuitry is illustrated in FIG. 8. The following chart describes the various circuit elements shown in FIG. 8.

| REF. No. | DESCRIPTION OF THE COMPONENT |
|---|---|
| U1" | DC/DC converter which serves as a voltage regulator and which is implemented using a DIP8 IC chip. The pins designated as pins 1–8 in the commercially available chip appear as pins 1U1, 2U1, 3U1, 4U1, 5U1, 6U1, 7U1 and 8U1, respectively. |
| U2" | NPN dual transistor chip manufactured by ZETEC and commercially available under part number ZDT1048. This chip forms part of the DC-to-AC conversion circuitry and provides on/off switching at a frequency which provides resonance with capacitor C5 and a sinusoidal signal at the transformer. The pins designated as pins 1–8 in the commercial chip appear in the drawings as pins 1U2, 2U2, 3U2, 4U2, 5U2, 6U2, 7U2 and 8U2, respectively. |
| U3A, U3B | operational amplifiers contained in a dual operational amplifier chip (dual op-amp) commercially available from National Semiconductor under part number LMC6572. The output pins 1–8 of the LMC6572 dual op-amp appear in the drawing as pins 1U3, 2U3, 3U3, 4U3, 5U3, 6U3, 7U3 and 8U3, respectively. |
| Z1 | voltage multiplier |
| T1 | transformer identical to that which is illustrated in FIG. 2. |
| CR1, CR2 | diodes commercially available from Micro Semiconductor (and many others) under part number 1N4148 which provide a shut-down enable function. To put the DC/DC converter U1 into a sleep mode, a voltage is applied at the S/O terminal. When this happens, the diodes CR1, CR2 cause the transistor Q1 to become conductive such that the terminal 8U1 of the DC/DC converter U1 is grounded. As a result, the DC/DC converter U1 enters a sleep mode wherein the input voltage $V_{IN}$ is no longer applied. This permits the high-voltage output to be shut-down while, at the same time, permitting any monitoring or indication functions to continue via, for example, terminals 1 MON 5 or PS OK 8. |
| CR3 | diode identical to diode CR1 or CR2. |
| CR4 | low forward voltage Schottky diode, preferably, a commercially available SK13 Schottky diode. |
| R1, R2, R8, R10, R13 | 100 kΩ resistors. |
| R3 | 953 kΩ resistor. |
| R4 | 536 kΩ resistor. |
| R5 | 953 kΩ resistor. |
| R6 | 536 kΩ resistor. |
| R7, R11 | 200 kΩ resistors. |
| R9 | 4.99 kΩ resister. |
| R12 | 499 kΩ resister. |
| R14 | 100 kΩ potentiometer having two stationary terminals 1R14 and 2R14 on opposite sides of a resistance and a variable resistance terminal 3R14 therebetween. By adjusting the variable resistance, the high-voltage output $V_{OUT}$ can be adjusted between 4,000 volts and |

-continued

| REF. No. | DESCRIPTION OF THE COMPONENT |
|---|---|
|  | 8,000 volts. |
| C1 | 100 μFarad capacitor, having a 10 volt rating. |
| C2 | 1 μFarad capacitor, having a 10 volt rating. |
| C3 | 0.01 μFarad capacitor. |
| C4 | 0.01 μFarad capacitor. |
| C5 | 0.047 μFarad capacitor having a 25 volt rating which serves as the capacitive element in providing resonance within the DC-to-AC converter's oscillator portion. Capacitor C5 preferably is a low loss capacitor (Low A/C equivalent resistance) to provide maximum conversion efficiency. |
| Q1 | transistor chip MMBT 4401 has a surface-mount configuration and provides turn off function for the MAX887 chip, by inverting its input. |
| Q2 | transistor chip MMBT 4401 has a surface-mount configuration and serves as a dynamic impedance which dynamically varies in response to the current-indicative voltage $V_{program}$ and thereby achieves the current-responsive aspect of the control voltage $V_{control}$. As the impedance of the transistor chip Q2 varies, the voltage at the node between resistor R3 and resistor R4 varies. Because a voltage divider network is defined by the combination of resistors R3, R4, R5 and R6, as well as the dynamic impedance of transistor chip Q2, the variation in voltage at the node between resistors R3 and R4 (i.e., the variation in $V_{control}$) is dependent upon both the current-indicative voltage $V_{program}$ and the input voltage $V_{IN}$. $V_{IN}$ therefore is regulated by the regulator in a manner dependent upon $V_{IN}$ itself and the current-indicative voltage $V_{program}$. |
| 60 | high-voltage, surface-mount connector for the high-voltage output from the multiplier Z1. Preferably, the connector is a male, one-pin connector. |
| P2 | nine-pin connector designed for mounting on a printed circuit board. |
| L1, L2 | 47 μH surface-mount inductors which are small in size and have a low resistance and high saturation current. |

The circuit illustrated in FIG. 8 is functionally very similar to that of FIG. 2. The individual op-amps, however, are shown separately in FIG. 8. The individual op-amps are replaced in FIG. 2 by the better performing LT 1490 which provides lower quiescent current and is less expensive. Also, U1 in FIG. 2 is implemented using the MAX 887 chip which is more efficient than what is illustrated in FIG. 8.

Figure 9:
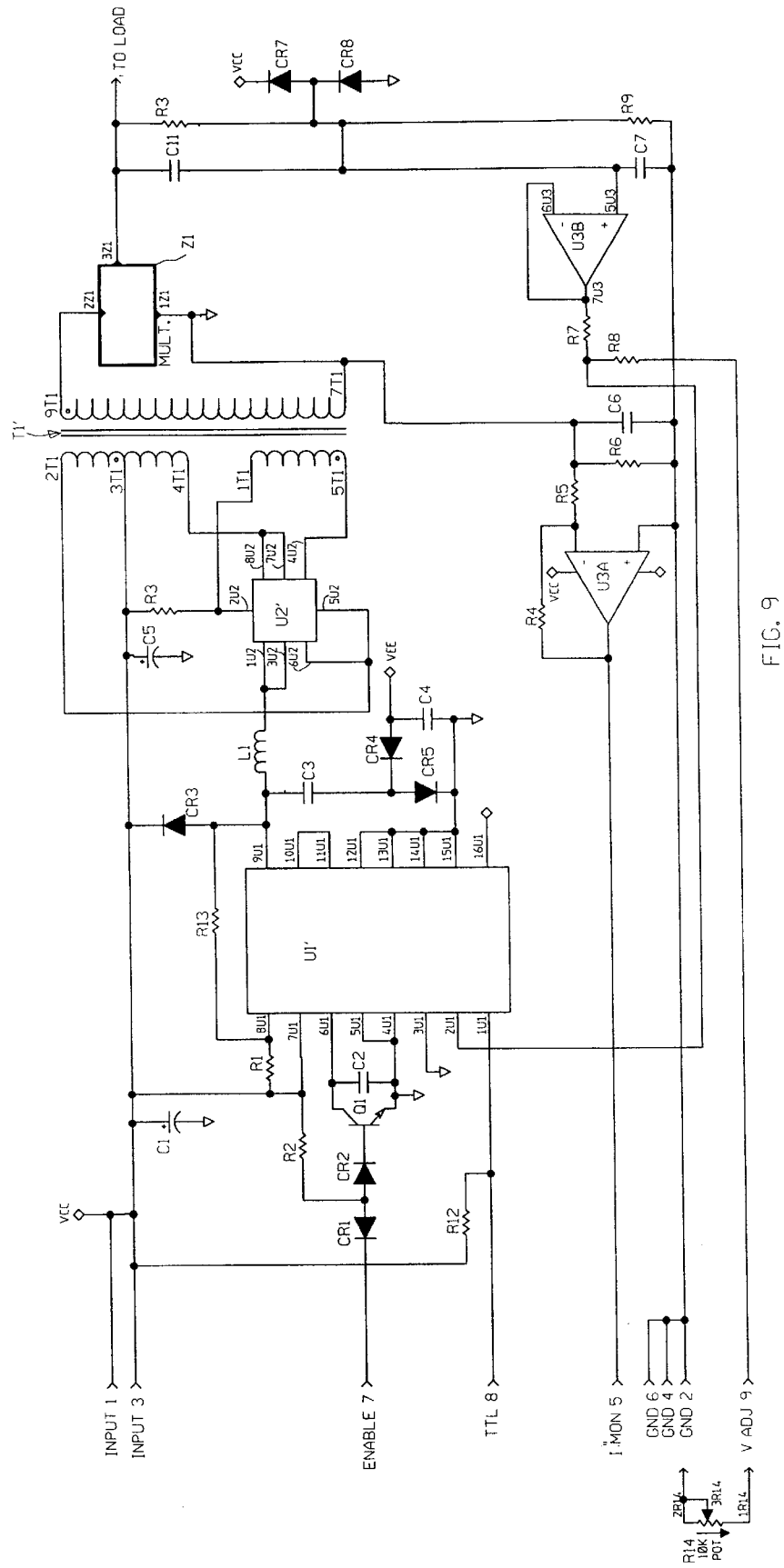
FIG. 9 is a circuit diagram of still another alternative circuit according to the present invention.

Still another example of such alternative circuitry is illustrated in FIG. 9. The following chart describes the various circuit elements shown in FIG. 9.

| REF. No. | DESCRIPTION OF THE COMPONENT |
|---|---|
| U1''' | a voltage regulator which is implemented using a step-down DC/DC converter IC chip commercially available from Motorola under part number MC34163DW. The pins designated as pins 1–16 in the commercially available chip appear as pins 1U1, 2U1, 3U1, 4U1, 5U1, 6U1, 7U1, 8U1, 9U1, 10U1, 11U1, 12U1, 13U1, 14U1, 15U1 and 16U1, respectively. |
| U2''' | NPN dual transistor chip manufactured by ZETEC and commercially available under part number ZDT1048. This chip forms part of the DC-to-AC conversion circuitry and provides on/off switching at a frequency which provides a sinusoidal signal at the transformer. The pins designated as pins 1–8 in the commercial chip appear in the drawings as pins 1U2, 2U2, 3U2, 4U2, 5U2, 6U2, 7U2 and 8U2, respectively. |
| U3A, U3B | operational amplifiers contained in a dual operational amplifier chip (dual op-amp) commercially available from National Semiconductor |

-continued

| REF. No. | DESCRIPTION OF THE COMPONENT |
|---|---|
| | under part number LMC6572. The output pins 1–8 of the LMC6572 dual op-amp appear in the drawing as pins 1U3, 2U3, 3U3, 4U3, 5U3, 6U3, 7U3 and 8U3, respectively. |
| Z1 | voltage multiplier |
| T1 | transformer identical to that which is illustrated in FIG. 7. |
| CR1, CR2 | diodes commercially available from Micro Semiconductors, Motorola and others under part number 1N4148. |
| CR3 | diode commercially available from Micro Semiconductors, Motorola and others under part number 1N5818. |
| CR4, CR5 | diodes commercially available from Micro Semiconductors, Motorola and others under part number 1N4148. |
| CR6 | diode used as a clamping diode to facilitate start-up of the oscillator portion. |
| CR7, CR8 | diodes commercially available from Micro Semiconductors, Motorola and others under part number 1N458. |
| R1 | .1 Ω resistor (preferably a wire wound resistor). |
| R2, R12 | 4.99 kΩ resistors. |
| R3 | 510 Ω resistor (preferably, a carbon composition resistor). |
| R4 | 200 kΩ resistor. |
| R5 | 100 kΩ resistor. |
| R6, R7 | 10 kΩ resistors. |
| R8 | 1.87 kΩ resistor. |
| R9 | 312.5 kΩ resistor. |
| R10 | 1000 MΩ resistor (preferably a thick film resistor). |
| R11 | 100 kΩ potentiometer having two stationary terminals 1R14 and 2R14 on opposite sides of a resistance and a variable resistance terminal 3R14 therebetween. By adjusting the variable resistance, the high-voltage output $V_{OUT}$ can be adjusted between 4,000 volts and 8,000 volts. |
| R13 | 110 Ω resistor. |
| C1 | 220 μFarad capacitor, having a 10 volt rating. |
| C2 | 0.0 μFarad capacitor. (optional capacitor location) |
| C3, C4, C6 | 1 μFarad capacitors. |
| C5 | 220 μFarad capacitor, having a 10 volt rating. |
| C7 | 0.01 μFarad capacitor. |
| C11 | 50 μFarad capacitor. |
| Q1 | transistor chip MMBT 4401 has a surface-mount configuration and provides an "enable" function for the MC34163DW chip. |
| L1 | 100 μH surface-mount inductor which is small in size and has a low resistance and high saturation current. |

Although the circuitry in FIG. 9 is generally effective, it requires a negative voltage $V_{EE}$ for the op-amps to operate correctly, it utilizes a voltage feedback from the high-voltage output and it therefore fails achieve some of the advantages of the circuitry illustrated in FIG. 2.

Figure 10:
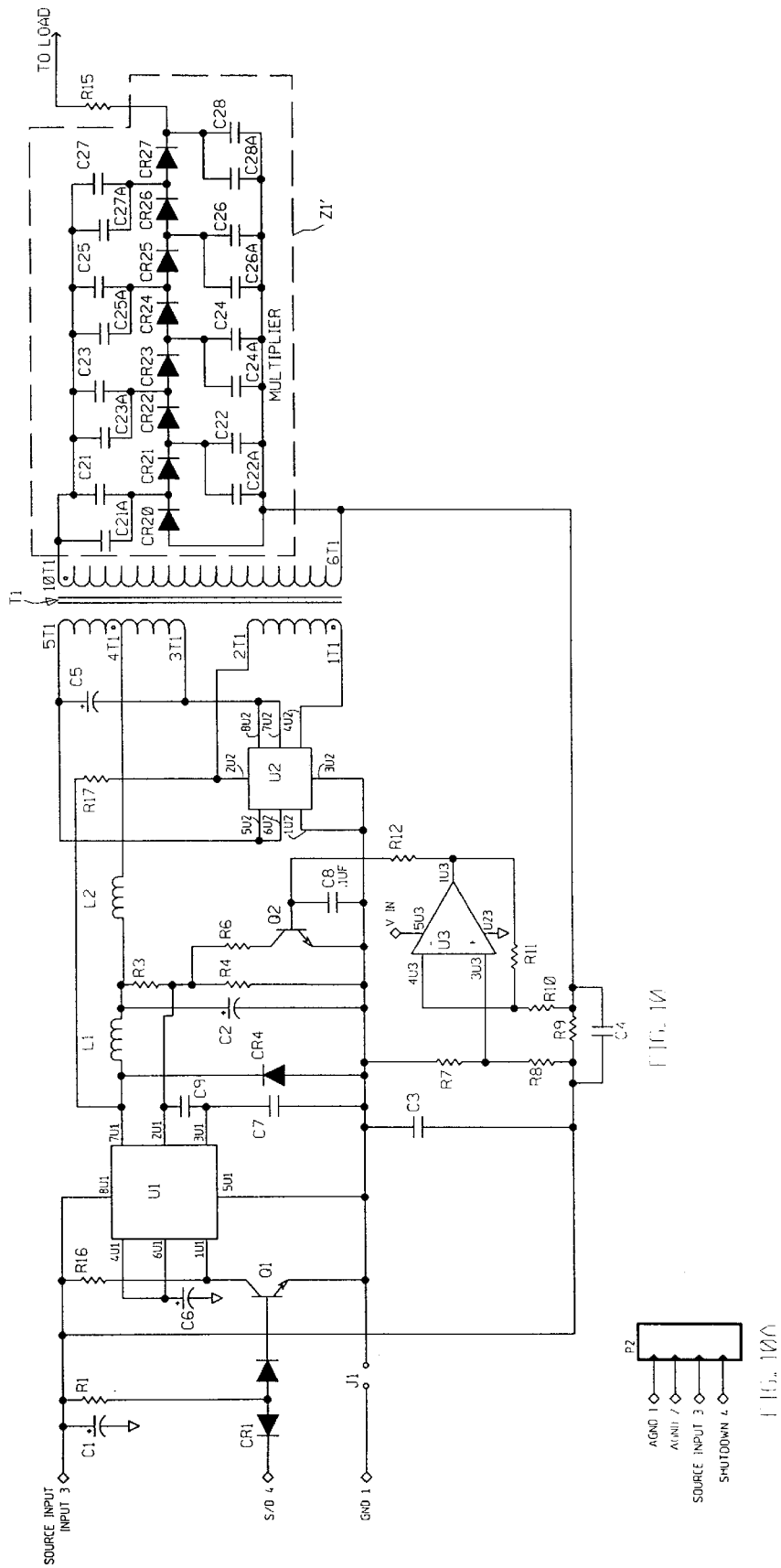
FIG. 10 is a circuit diagram of yet another alternative circuit according to the present invention.
Figure 11:
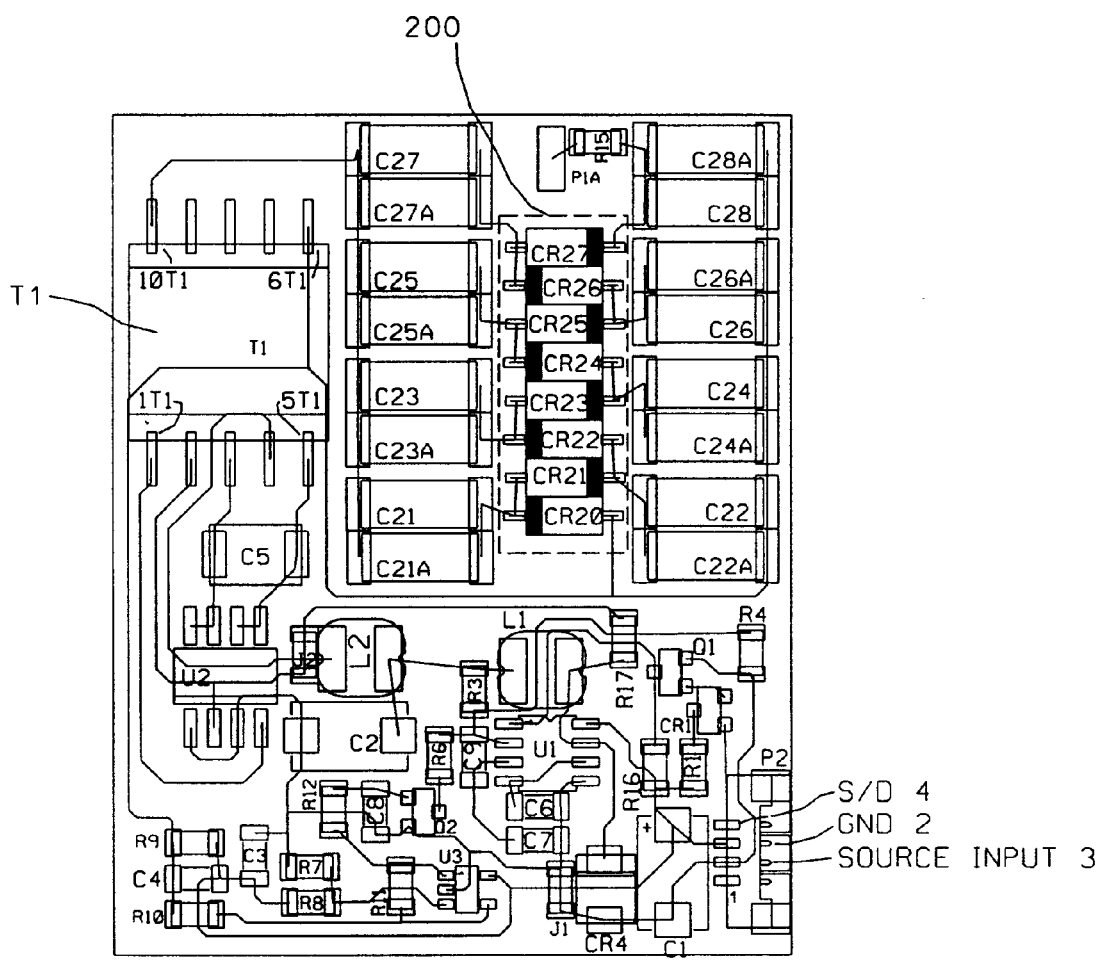
FIG. 11 is a plan view of a preferred physical arrangement of the circuit illustrated in FIG. 10.

FIG. 10 is a circuit diagram of yet another alternative circuit according to the present invention. FIG. 11 is a plan view of a preferred physical arrangement of the circuit illustrated in FIG. 10. The following chart describes the components of the circuit illustrated in FIGS. 10 and 11.

| REF. No. | DESCRIPTION OF THE COMPONENT |
|---|---|
| U1"" | DC/DC converter which serves as a voltage regulator. A preferred chip for use in achieving the DC/DC converter is the MAX887 controller IC chip commercially available from MAXIM Integrated Products Inc. The pins designated as pins 1–8 in the commercially available chip appear as pins 1U1, 2U1, 3U1, 4U1, 5U1, 6U1, 7U1 and 8U1, respectively. |
| U2"" | NPN dual transistor chip manufactured by ZETEC and commercially available under part number ZDT1048. This chip forms part of the DC-to-AC conversion circuitry and provides on/off switching at a frequency which provides resonance with capacitor C5 and a sinusoidal signal at the transformer. The pins designated as pins 1–8 in the commercially available chip appear in the drawings as pins 1U2, 2U2, 3U2, 4U2, 5U2, 6U2, 7U2 and 8U2, respectively. |
| U3"" | operational amplifier (op-amp) chip commercially available from MAXIM Integrated Products Inc. under part number MAX4162. The pins 1–5 of the commercially available op-amp appear in the drawing as pins 1U3, 2U3, 3U3, 4U3 and 5U3, respectively. |
| Z1' | voltage multiplier |
| T1 | transformer commercially available from Toko under part number 678XN-1081 and having a maximum thickness of 5.1 millimeters. This transformer is preferred over other transformers having similar electrical characteristics primarily because of its compact size. |
| CR1 | dual diodes in one package which provide a shut-down enable function. To put the DC/DC converter U1"" into a sleep mode, a voltage is applied at the S/D (shut-down) terminal. When this happens, the dual diodes CR1 cause the transistor Q1 to become conductive such that the terminal 1U1 of the DC/DC converter U1"" is grounded. As a result, the DC/DC converter U1"" enters a sleep mode wherein the input voltage $V_{IN}$ is no longer applied. This permits the high-voltage output to be shut-down. |
| CR4 | low forward voltage Schottky diode, preferably, a commercially available SK13 Schottky diode. |
| CR20 through CR27 | diodes which are epoxy-molded into a diode array block 200. |
| R1, R8, R10 | 100 kΩ resistor. |
| R3 | 22 kΩ +/− 1% resistor. |
| R4 | 11 kΩ +/− 1% resistor. |
| R6 | 56.2 kΩ resistor. |
| R7, R11 | 220 kΩ resistor. |
| R15 | |
| R9 | 4.99 kΩ +/− 1% resistor. |
| R12 | 3 MΩ resistor. |
| R16 | 100 kΩ resistor. |
| R17 | 3.48 kΩ resistor. |
| C1, C2 | 100 μFarad, 10 V rated, capacitors. |
| C3 | 0.01 μFarad capacitor. |
| C4 | 1 μFarad capacitor. |
| C5 | 0.1 μFarad ceramic capacitor having a 25 volt rating which serves as the capacitive element in providing resonance within the DC-to-AC converter's oscillator portion. Capacitor C5 preferably is a low loss capacitor (Low A/C equivalent resistance) to provide maximum conversion efficiency. |
| C6 | 2.2 μFarad, 10 volt rated, capacitor. |
| C7 | 0.047 μFarad, 10 volt rated, capacitor. |
| C8 | 0.1 μFarad capacitor. |
| C9 | 6800 pFarad capacitor. |
| C21, C21A through C28, C28A | 181 pFarad (at 8,000 volts), high-voltage, surface-mountable capacitors. |
| Q1 | transistor chip MMBT 4401 has a surface-mount configuration and provides a turn off function for the MAX687 chip, by inverting its input. |
| Q2 | transistor chip MMBT 4401 has a surface-mount configuration and serves as a dynamic impedance which dynamically varies in response to the current-indicative voltage $V_{program}$ and thereby achieves the current-responsive aspect of the control voltage $V_{control}$. As the impedance of the |

-continued

| REF. No. | DESCRIPTION OF THE COMPONENT |
|---|---|
| | transistor chip Q2 varies, the voltage at the node between resistor R3 and resistor R4 varies. Because a voltage divider network is defined by the combination of resistors R3, R4 and R6, as well as the dynamic impedance of transistor chip Q2, the variation in voltage at the node between resistors R3 and R4 (i.e., the variation in $V_{control}$) is dependent upon both the current-indicative voltage $V_{program}$ and the input voltage $V_{IN}$. $V_{IN}$ therefore is regulated by the regulator in a manner dependent upon $V_{IN}$ itself and the current-indicative voltage $V_{program}$. |
| P2"" | four-pin connector having a 0.050" pin spacing and designed for mounting on a printed circuit board. |
| L1, L2 | 47 µH surface-mount inductors which are small in size and have a low resistance and high saturation current. |
| J1, J2 | conductive jumpers physically located in the circuit at locations where conductive traces on the circuit board cross-over one another but should not make electrical contact. |

The four pin connector P2"" is illustrated schematically in FIG. 10A and includes an unused pin AGND 1, a ground pin AGND2, a source input pin SOURCE INPUT 3, and a shut-down pin SHUTDOWN 4.

Figure 12A:
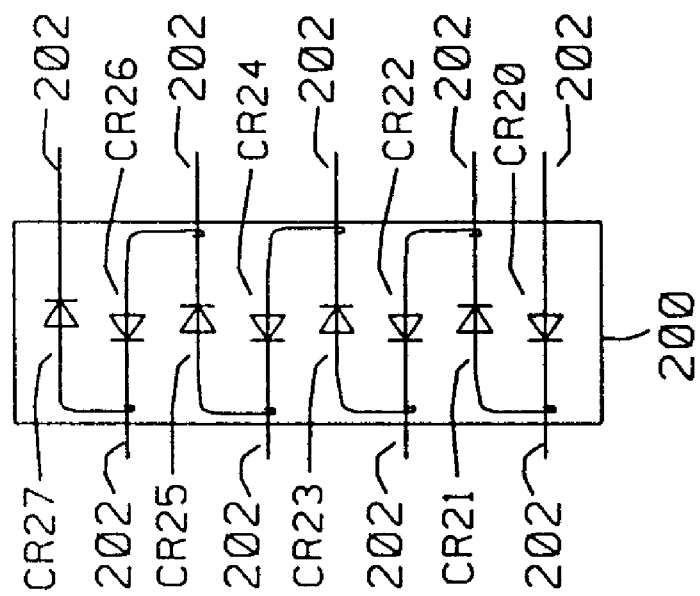
FIGS. 12 and 12A schematically illustrate a diode array block according to a preferred embodiment of the circuit illustrated in FIG. 10.
Figure 12:
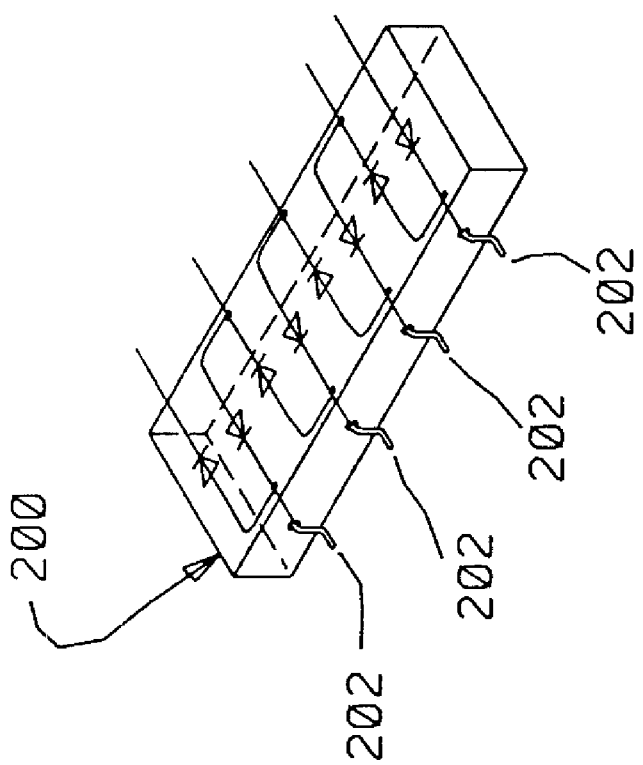

FIGS. 12 and 12A schematically illustrate an epoxy-molded diode array block 200 according to a preferred embodiment of the circuit illustrated in FIGS. 10 and 11. All of the diodes CR20–CR27 are connected electrically in series, but physically in parallel. A node is defined electrically between each pair of diodes. Such nodes are electrically connected to respective terminals 202 which project out from the epoxy-molded diode array block 200 and are connected to respective pairs of the capacitors C21, C21A through C28,C28A.

The epoxy-molded diode array block 200 of FIGS. 12 and 12A advantageously can be manufactured so that the block 200 is about 0.15 inch thick, about 0.75 inch long, and about 0.275 inch wide.

Figure 13:
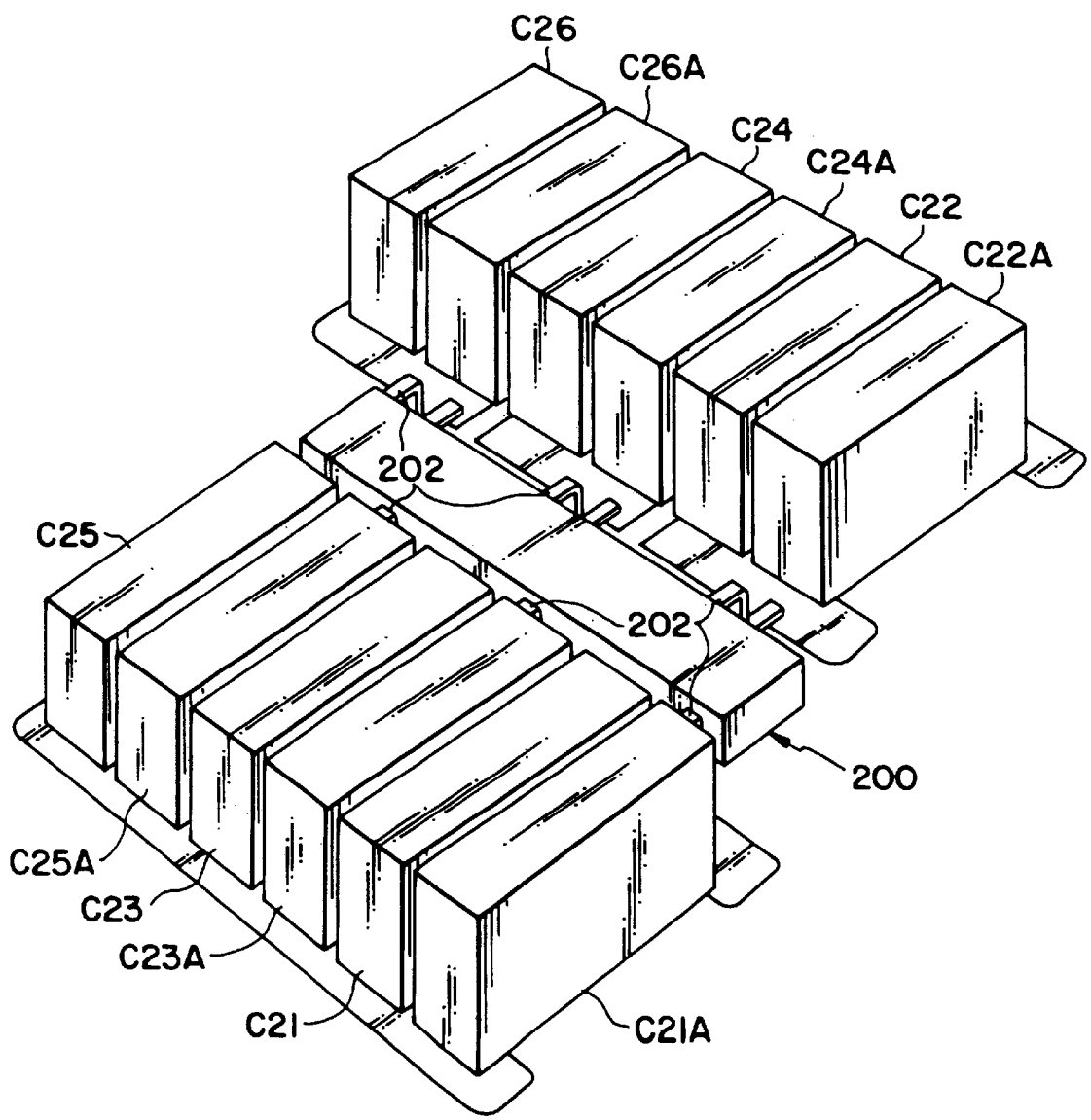
FIG. 13 is a perspective view of a multiplier similar to that which is illustrated in FIGS. 10–12, except that the multiplier of FIG. 13 has only six diodes and twelve capacitors.

FIG. 13 is a perspective view of a multiplier similar to that which is illustrated in FIGS. 10–12, except that the multiplier of FIG. 13 has only six diodes and twelve capacitors.

While the present invention has been described with reference to the above exemplary embodiments, it is understood that the present invention is not limited to such embodiments. To the contrary, the present invention is limited only by the scope of the appended claims.

I claim:

1. A power supply device for providing high-voltage power from a low-voltage source, said power supply device comprising:
a voltage regulator for connection to said low-voltage source, said voltage regulator being arranged so as to step-down a source voltage level of said low-voltage source to produce an input voltage at a lower voltage level than said source voltage level wherein said input voltage has a variable voltage level;
a DC-to-AC converter connected to said input voltage from said voltage regulator, said DC-to-AC converter being arranged so as to convert said input voltage into an AC voltage;
a multiplier connected to the AC voltage from said DC-to-AC converter, said multiplier being arranged so as to convert the AC voltage into a substantially DC output signal having a DC voltage level which is significantly higher than said source voltage level.

2. The power supply device of claim 1, wherein said multiplier comprises an assembly of capacitors and diodes which are interconnected to form a voltage multiplier.

3. The power supply device of claim 1, wherein said regulator is a single dynamic regulator.

4. The power supply device of claim 3, and further comprising a regulator controller connected, at least indirectly, to said multiplier, said regulator controller being arranged so that when said multiplier is connected to an electrical load, a voltage indicative of current flowing between said multiplier and the electrical load is applied to said regulator controller, said regulator controller being connected to said dynamic regulator so as to provide a control signal to said dynamic regulator, the control signal being dependent, at least in part, on said voltage indicative of current, said dynamic regulator being arranged so as to regulate said input voltage level in a manner dependent upon said control signal.

5. The power supply device of claim 3, and further comprising sampling circuitry connected electrically between said multiplier and said regulator controller, said sampling circuitry being arranged so as to provide said voltage indicative of current without drawing more than 0.003% of power flowing to said electrical load.

6. The power supply device of claim 3, wherein sahd regulator controller is connected to said input voltage, said regulator controller being responsive to said input vol age so that said control signal is provided to said dynamic regulator in a manner dependent on both of said input voltage and saud voltage indicative of current.

7. The power supply device of claim 3, wherein said regulator controller is arranged so as to selectively determine a level of said control signal such that:
when said voltage indicative of current indicates that the current flowing between said multiplier and said electrical load is increasing, said dynamic regulator increases the input voltage, and
when said voltage indicative of current indicates that the current flowing between said multiplier and said electrical load is decreasing, said dynamic regulator decreases the input voltage.

8. The power supply device of claim 7, wherein said regulator controller is responsive to said input voltage such that said increases and decreases of the input voltage also are dependent upon a present level of the input voltage.

9. The power supply device of claim 1, wherein said regulator controller is connected to said input voltage, said regulator controller being responsive to said input voltage so that said regulator controller determines said level of the control signal in a manner which is also dependent upon the level of the input voltage.

10. The power supply device of claim 1, wherein said regulator is arranged so that, as said low-voltage source becomes depleted, said regulator continues to provide said input voltage at progressively decreasing voltage levels, at least until said source voltage decreases to one half of the source voltage of a fully charged low-voltage source.

11. The power supply device of claim 1, wherein said regulator is arranged so that, as said low-voltage source becomes depleted, said regulator continues to provide said input voltage at progressively decreasing voltage levels, at least until said source voltage decreases to 20% of the source voltage of a fully charged low-voltage source.

12. The power supply device of claim 1, wherein said DC voltage level is at least one thousand times the source voltage level.

13. The power supply device of claim 1, wherein said DC voltage level is between 1440 and 1760 times the source voltage level.

14. The power supply device of claim 1, wherein said regulator, DC-to-AC converter, and said multiplier are packaged together such that a profile of said power supply device is less than one half inch in thickness.

15. The power supply device of claim 1, wherein said regulator, DC-to-AC converter, and said multiplier are packaged together such that a profile of said power supply device is less than four tenth of an inch in thickness.

16. The power supply device of claim 1, wherein said multiplier comprises:
   first and second capacitor arrays spaced apart from each other, each capacitor array defining a plurality of capacitors;
   a diode located on a surface of each of said plurality of capacitors; and
   a terminal assembly having:
      a first set of conductive leads arranged so as to electrically connect respective diodes on said first capacitor array to respective capacitors of said second capacitor array, and
      a second set of conductive leads arranged so as to electrically connect respective diodes on said second capacitor array to respective capacitors of said first capacitor array.

17. The power supply device of claim 16, wherein said first and second capacitor arrays have a spatial relationship so that said first and second capacitor arrays are arranged in a substantially parallel fashion to one another, and said surface is a capacitor top surface.

18. The power supply device of claim 17, wherein said terminal assembly further comprises first and second ends, the conductive leads defining said first and second set of conductive leads being alternatingly arranged between said first and second ends.

19. The power supply device of claim 18, wherein each conductive lead of said first and second set of conductive leads includes a substantially straight terminal and an oppositely arranged, downwardly projecting terminal;
   the downwardly projecting terminal being connected to one of said capacitors and the substantially straight terminal being connected to one of said diode.

20. The power supply device of claim 16, wherein said first and second sets of conductive leads are arranged within an electrically insulative body, said first and second set of conductive leads having terminal portions over said first and second capacitor arrays which extend out from said insulative body.

21. A voltage multiplier capable of converting an AC voltage into a substantially DC high-voltage output signal, said multiplier comprising:
   first and second capacitor arrays spaced apart from each other, each capacitor array defining a plurality of capacitors;
   a diode located on a surface of each of said plurality of capacitors; and
   a terminal assembly having:
      a first set of conductive leads arranged so as to electrically connect respective diodes on said first capacitor array to respective capacitors of said second capacitor array, and
      a second set of conductive leads arranged so as to electrically connect respective diodes on said second capacitor array to respective capacitors of said first capacitor array.

22. The voltage multiplier of claim 21, wherein said first and second capacitor arrays have a spatial relationship so that said first and second capacitor arrays are arranged in a substantially parallel fashion to one another, and said surface is a capacitor top surface.

23. The voltage multiplier of claim 22, wherein said terminal assembly further comprises first and second ends, the conductive leads defining said first and second set of conductive leads being alternatingly arranged between said first and second ends.

24. The voltage multiplier of claim 23, wherein each conductive lead of said first and second set of conductive leads includes a substantially straight terminal and an oppositely arranged, downwardly projecting terminal;
   the downwardly projecting terminal being connected to one of said capacitors and the substantially straight terminal being connected to one of said diode.

25. The voltage multiplier of claim 21, wherein said first and second sets of conductive leads are arranged within an electrically insulative body, said first and second set of conductive leads having terminal portions over said first and second capacitor arrays which extend out from said insulative body.

26. A power supply device for providing high-voltage power from a low-voltage source, said power supply device comprising:
   regulator means connectable to said low-voltage source, for stepping down a source voltage level of said low-voltage source to produce an input voltage at a lower voltage level than said source voltage level wherein said input voltage has a variable voltage levels;
   a DC-to-AC converter means connected to said input voltage, for converting said input voltage into an AC voltage;
   multiplier means connected to the AC voltage from said DC-to-AC converter means, for converting the AC voltage into a substantially DC output signal having a DC voltage level which is significantly higher than said source voltage level.

27. The voltage multiplier of claim 21, wherein
   each capacitor forming said first capacitor array shares a first common electrode; and
   each capacitor forming said second capacitor array shares a second common electrode.

* * * * *